(12) United States Patent
Meguro et al.

(10) Patent No.: US 6,843,277 B2
(45) Date of Patent: Jan. 18, 2005

(54) DUCT AND ELECTRONIC APPARATUS HAVING THE DUCT

(75) Inventors: Hiroyuki Meguro, Matsumoto (JP); Hiroshi Abe, Matsumoto (JP); Toshiaki Hashizume, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 244 days.

(21) Appl. No.: 10/188,795

(22) Filed: Jul. 5, 2002

(65) Prior Publication Data

US 2003/0066630 A1 Apr. 10, 2003

(30) Foreign Application Priority Data

Jul. 6, 2001 (JP) ........................................ 2001-206562

(51) Int. Cl.[7] ................................................. F16L 9/14
(52) U.S. Cl. ........................ 138/125; 138/145; 138/146; 138/172; 138/DIG. 7; 428/36.2
(58) Field of Search ................................. 138/172, 174, 138/DIG. 7, 143, 144–146, 125; 428/34.2, 36.2

(56) References Cited

U.S. PATENT DOCUMENTS

| | | | | |
|---|---|---|---|---|
| 3,587,656 A | * | 6/1971 | Cunningham | 138/144 |
| 3,657,516 A | * | 4/1972 | Fujihara | 392/435 |
| 4,025,675 A | * | 5/1977 | Jonda | 428/36.2 |
| 4,421,497 A | * | 12/1983 | Federmann et al. | 464/181 |
| 4,967,798 A | * | 11/1990 | Hammer et al. | 138/118.1 |
| 5,037,688 A | * | 8/1991 | Uchida | 428/102 |
| 5,167,994 A | * | 12/1992 | Paulson | 428/34.2 |
| 5,178,706 A | * | 1/1993 | Nishibara et al. | 156/229 |
| 5,325,893 A | * | 7/1994 | Takagi et al. | 138/143 |
| 5,393,582 A | * | 2/1995 | Wang et al. | 428/34.2 |
| 5,472,154 A | * | 12/1995 | Qiu et al. | 242/609.4 |
| 5,736,179 A | * | 4/1998 | Hammer et al. | 426/105 |
| 6,106,413 A | * | 8/2000 | Kusumoto | 473/319 |

* cited by examiner

Primary Examiner—Patrick Brinson
(74) Attorney, Agent, or Firm—Oliff & Berridge, PLC

(57) ABSTRACT

The invention provides a duct with high sound absorbing effect and sufficient exhausting efficiency, as well as an electronic apparatus having the duct. The duct can include a hollow duct body, an inflated section arranged at an intermediate part of a passage of the duct body, and a sponge bonded on internal surfaces of the duct body and the inflated section. The duct body and the inflated section can have a thickness of 0.25 mm and be formed of a sheet member of paper impregnated with polymethylpentene on the surface thereof. The duct body can also include an intake-port side duct body and an exhaust-port side duct body, which are connected together at an angle of 90° therebetween. Further, a fan can be connected to an intake port of the intake-port side duct body 201. The inflated section can be arranged in the side of the intake port, and the cross-sectional area of the inflated section can be 1.8 times that of the duct body.

36 Claims, 29 Drawing Sheets

[FIG.1]
(A)
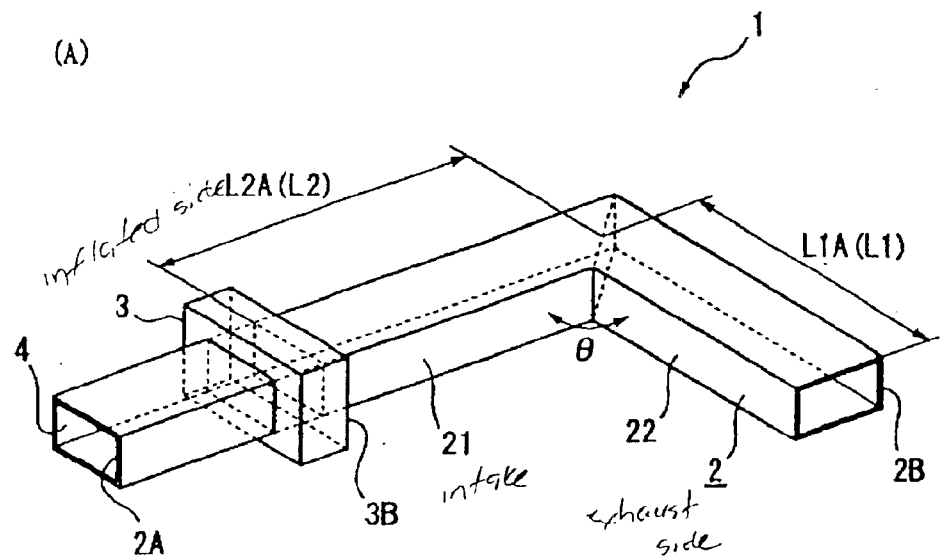
(B)
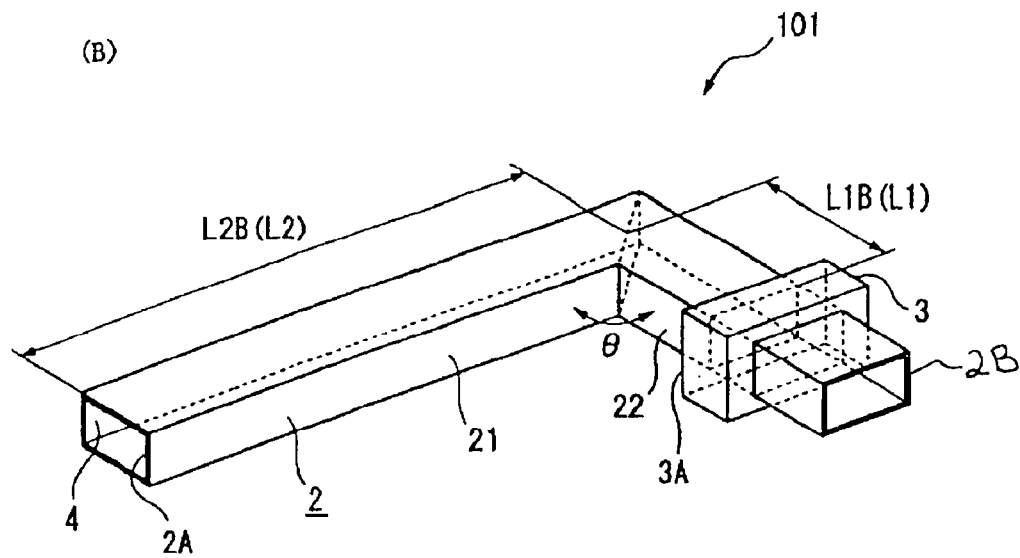

[Fig. 2]
L18 ORTHOGONAL TABLE $(2^1 \times 3^7)$
|  | 1 | 2 | 3 | 4 | 5 | 6 | 7 | 8 |
|---|---|---|---|---|---|---|---|---|
| NO. 1 | 1 | 1 | 1 | 1 | 1 | 1 | 1 | 1 |
| NO. 2 | 1 | 1 | 2 | 2 | 2 | 2 | 2 | 2 |
| NO. 3 | 1 | 1 | 3 | 3 | 3 | 3 | 3 | 3 |
| NO. 4 | 1 | 2 | 1 | 1 | 2 | 2 | 3 | 3 |
| NO. 5 | 1 | 2 | 2 | 2 | 3 | 3 | 1 | 1 |
| NO. 6 | 1 | 2 | 3 | 3 | 1 | 1 | 2 | 2 |
| NO. 7 | 1 | 3 | 1 | 2 | 1 | 3 | 2 | 3 |
| NO. 8 | 1 | 3 | 2 | 3 | 2 | 1 | 3 | 1 |
| NO. 9 | 1 | 3 | 3 | 1 | 3 | 2 | 1 | 2 |
| NO. 10 | 2 | 1 | 1 | 3 | 3 | 2 | 2 | 1 |
| NO. 11 | 2 | 1 | 2 | 1 | 1 | 3 | 3 | 2 |
| NO. 12 | 2 | 1 | 3 | 2 | 2 | 1 | 1 | 3 |
| NO. 13 | 2 | 2 | 1 | 2 | 3 | 1 | 3 | 2 |
| NO. 14 | 2 | 2 | 2 | 3 | 1 | 2 | 1 | 3 |
| NO. 15 | 2 | 2 | 3 | 1 | 2 | 3 | 2 | 1 |
| NO. 16 | 2 | 3 | 1 | 3 | 2 | 3 | 1 | 2 |
| NO. 17 | 2 | 3 | 2 | 1 | 3 | 1 | 2 | 3 |
| NO. 18 | 2 | 3 | 3 | 2 | 1 | 2 | 3 | 1 |
[Fig. 3]
CONTROL FACTOR AB
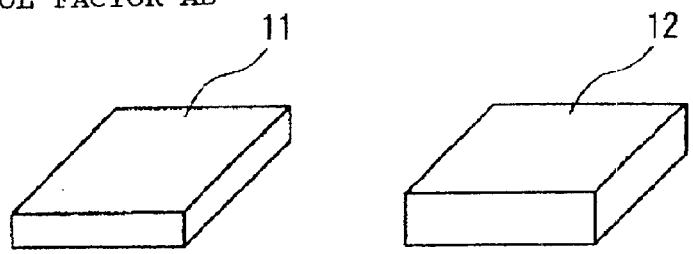

[Fig. 4]
CONTROL FACTOR C
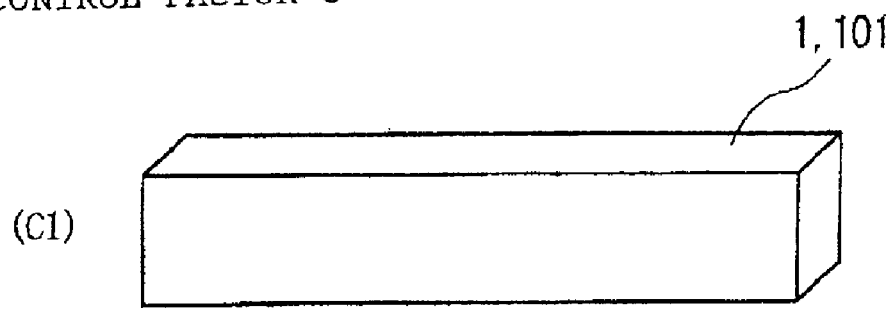
(C1)
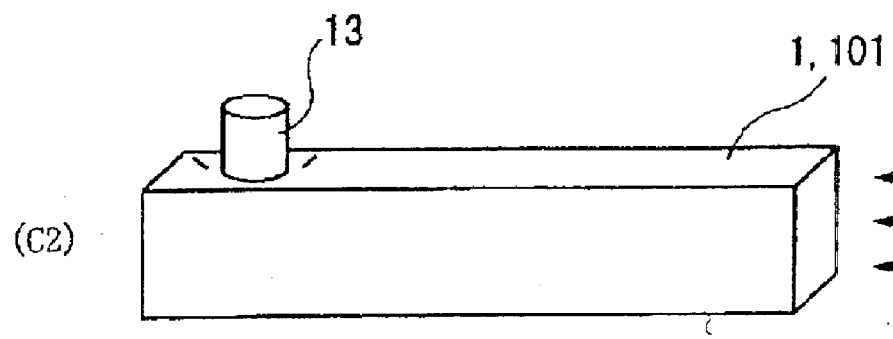
(C2)
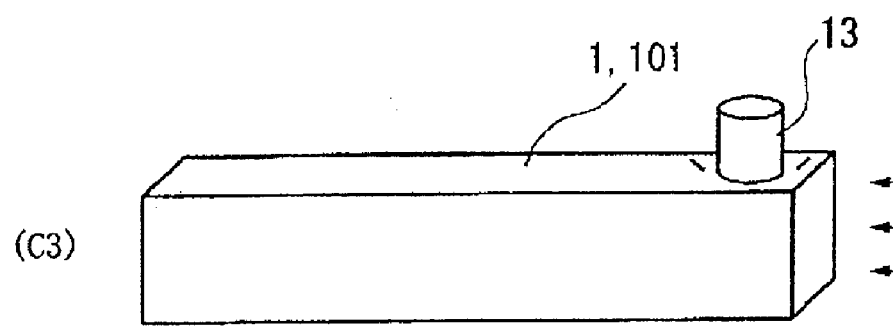
(C3)

[Fig. 5]
CONTROL FACTOR D
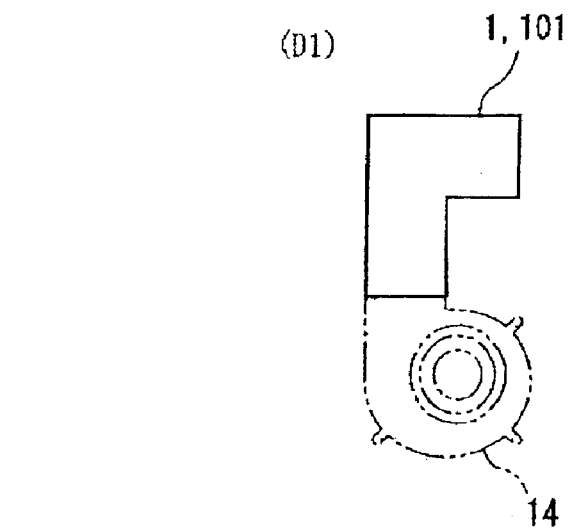
(D1)
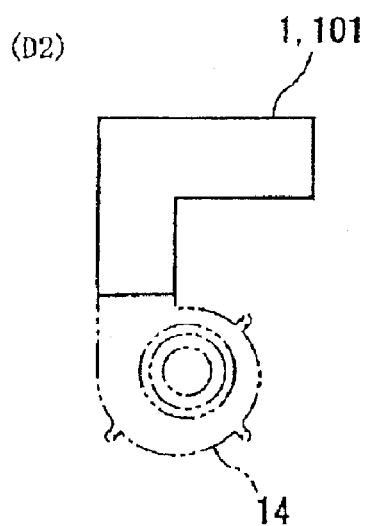
(D2)
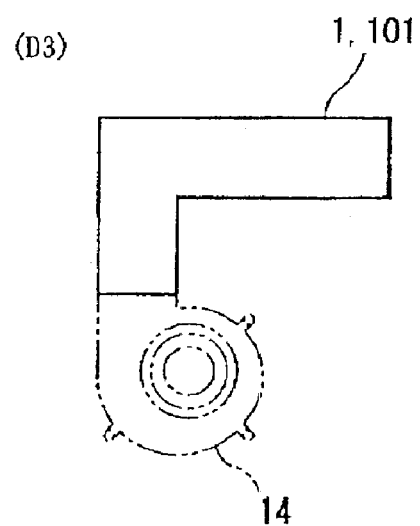
(D3)

[Fig. 6]
CONTROL FACTOR E
(E1)
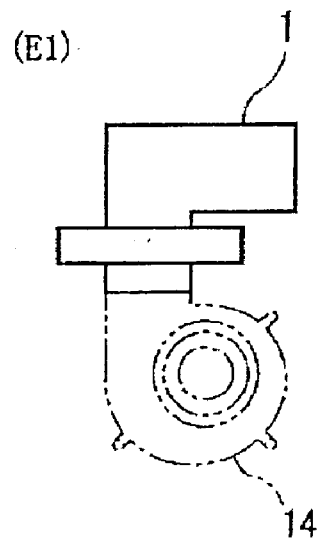
(E2)
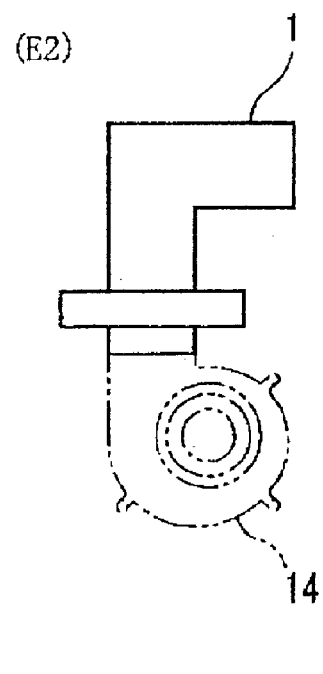
(E3)
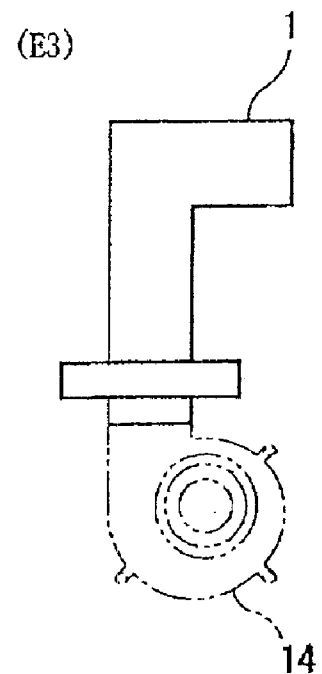

[Fig. 7]
CONTROL FACTOR F
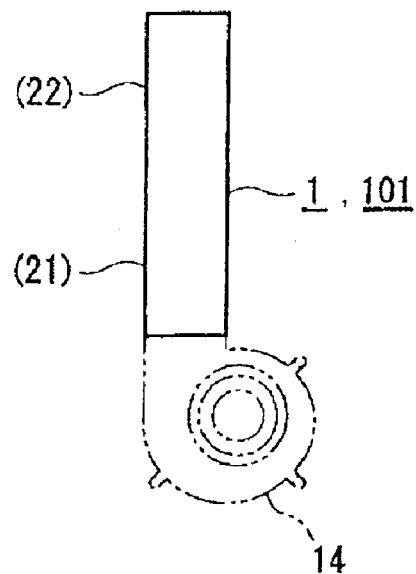
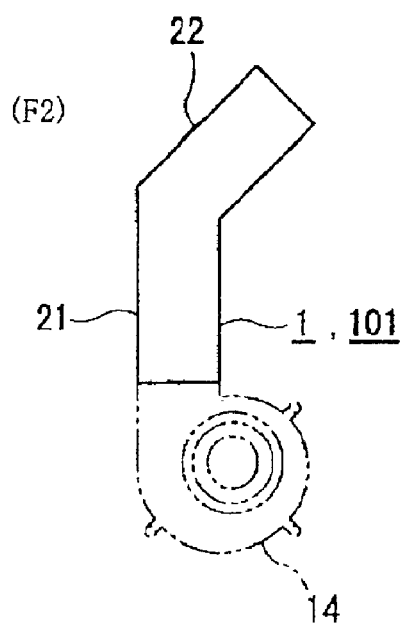
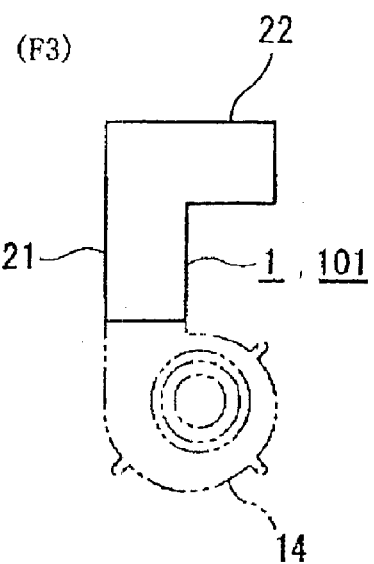

[Fig. 8]
CONTROL FACTOR G
(G1)
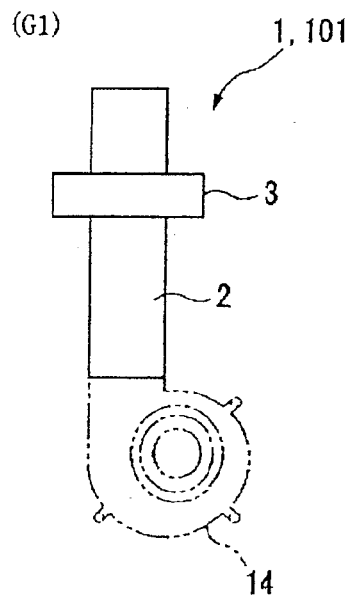
(G2)
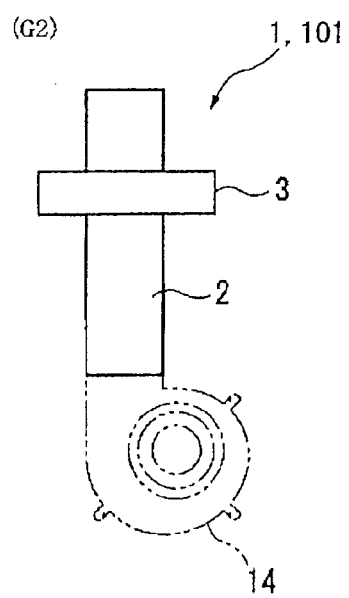
(G3)
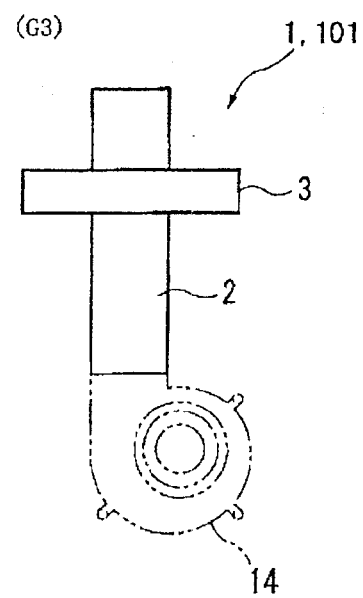

[Fig. 9]
CONTROL FACTOR H
(H1)
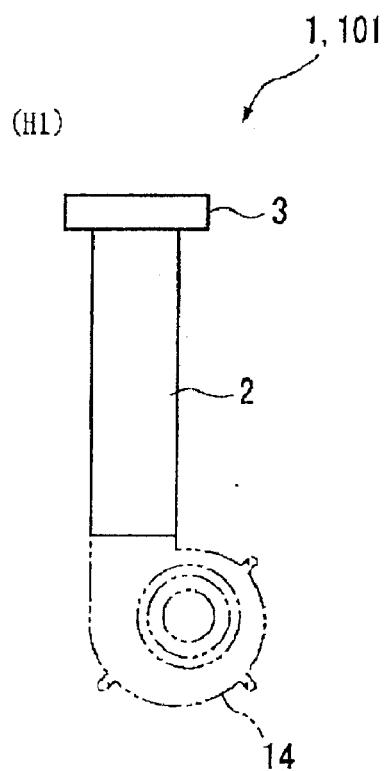
(H2) 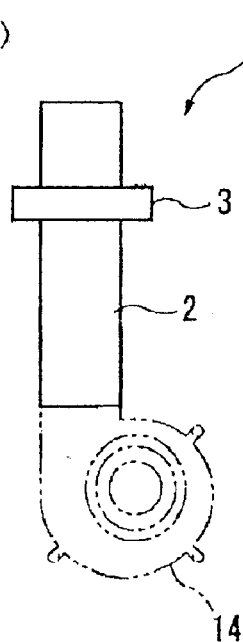   (H3) 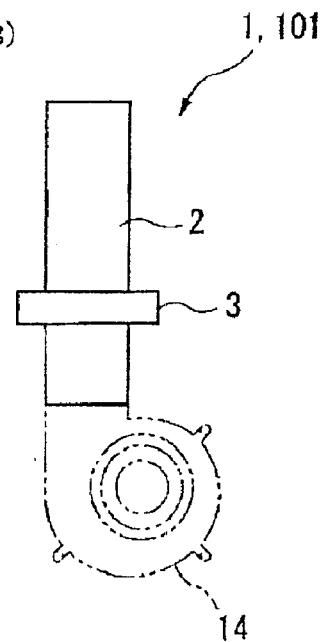

[Fig. 10]

TABULATION OF CONTROL FACTORS

| L18 MULTI-LEVEL | | LEVEL 1 | LEVEL 2 | LEVEL 3 | LEVEL 4 | LEVEL 5 | LEVEL 6 |
|---|---|---|---|---|---|---|---|
| AB | SPONGE | NONE | ENTIRE (THIN) | ENTIRE (THICK) | PART (THIN) | PART (THICK) | NONE |
| C | FIX | FREE | WEIGHT EXHAUST | WEIGHT INTAKE | | | |
| D | EXHAUST LENGTH | SMALL | ORDINARY | LARGE | | | |
| E | INTAKE LENGTH | SMALL | ORDINARY | LARGE | | | |
| F | ANGLE | 180° | 135° | 90° | | | |
| G | MUFFLER SHAPE | 1(1.2 TIMES) | 2(1.5 TIMES) | 3(1.8 TIMES) | | | |
| H | MUFFLER POSITION | EXHAUST PORT | EXHAUST SIDE | INTAKE SIDE | | | |

[Fig. 11]

LAYING OUT OF CONTROL FACTORS IN L18 ORTHOGONAL TABLE

| EXPERIMENTAL NO | CONTROL FACTORS | | | | | | | |
|---|---|---|---|---|---|---|---|---|
| | AB SPONGE | C FIX | EXHAUST LENGTH (D) | INTAKE LENGTH (E) | ANGLE (F) | MUFFLER SHAPE (G) | MUFFLER POSITION (H) | |
| 1 | NONE | FREE | SMALL | SMALL | 180 | 1 | EXHAUST PORT | |
| 2 | NONE | WEIGHT EXHAUST | ORDINARY | ORDINARY | 135 | 2 | EXHAUST SIDE | |
| 3 | NONE | WEIGHT INTAKE | LARGE | LARGE | 90 | 3 | INTAKE SIDE | |
| 4 | ENTIRE(THIN) | FREE | SMALL | ORDINARY | 135 | 3 | INTAKE SIDE | |
| 5 | ENTIRE(THIN) | WEIGHT EXHAUST | ORDINARY | LARGE | 90 | 1 | EXHAUST PORT | |
| 6 | ENTIRE(THIN) | WEIGHT INTAKE | LARGE | SMALL | 180 | 2 | EXHAUST SIDE | |
| 7 | ENTIRE(THICK) | FREE | ORDINARY | SMALL | 90 | 2 | INTAKE SIDE | |
| 8 | ENTIRE(THICK) | WEIGHT EXHAUST | LARGE | ORDINARY | 180 | 3 | EXHAUST PORT | |
| 9 | ENTIRE(THICK) | WEIGHT INTAKE | SMALL | LARGE | 135 | 1 | EXHAUST SIDE | |
| 10 | PART(THIN) | FREE | LARGE | LARGE | 135 | 2 | EXHAUST PORT | |
| 11 | PART(THIN) | WEIGHT EXHAUST | SMALL | SMALL | 90 | 3 | EXHAUST SIDE | |
| 12 | PART(THIN) | WEIGHT INTAKE | ORDINARY | ORDINARY | 180 | 1 | INTAKE SIDE | |
| 13 | PART(THICK) | FREE | ORDINARY | LARGE | 180 | 3 | EXHAUST PORT | |
| 14 | PART(THICK) | WEIGHT EXHAUST | LARGE | SMALL | 135 | 1 | INTAKE SIDE | |
| 15 | PART(THICK) | WEIGHT INTAKE | SMALL | ORDINARY | 90 | 2 | EXHAUST PORT | |
| 16 | NONE | FREE | LARGE | ORDINARY | 90 | 1 | EXHAUST SIDE | |
| 17 | NONE | WEIGHT EXHAUST | SMALL | LARGE | 180 | 2 | INTAKE SIDE | |
| 18 | NONE | WEIGHT INTAKE | ORDINARY | SMALL | 135 | 3 | EXHAUST PORT | |

[Fig. 12]

LAYING OUT OF CONTROL FACTORS IN L18 ORTHOGONAL TABLE

| EXPERIMENTAL NO. | CONTROL FACTORS | | | | | | |
|---|---|---|---|---|---|---|---|
| | AB | C | D | E | F | G | H |
| | SPONGE | FIX | EXHAUST LENGTH | INTAKE LENGTH | ANGLE | MUFFLER SHAPE | MUFFLER POSITION |
| 1 | 1 | 1 | 1 | 1 | 1 | 1 | 1 |
| 2 | 1 | 2 | 2 | 2 | 2 | 2 | 2 |
| 3 | 1 | 3 | 3 | 3 | 3 | 3 | 3 |
| 4 | 2 | 1 | 1 | 2 | 2 | 3 | 3 |
| 5 | 2 | 2 | 2 | 3 | 3 | 1 | 1 |
| 6 | 2 | 3 | 3 | 1 | 1 | 2 | 2 |
| 7 | 3 | 1 | 2 | 1 | 3 | 2 | 3 |
| 8 | 3 | 2 | 3 | 2 | 1 | 3 | 1 |
| 9 | 3 | 3 | 1 | 3 | 2 | 1 | 2 |
| 10 | 4 | 1 | 3 | 3 | 2 | 2 | 1 |
| 11 | 4 | 2 | 1 | 1 | 3 | 3 | 2 |
| 12 | 4 | 3 | 2 | 2 | 1 | 1 | 3 |
| 13 | 5 | 1 | 2 | 3 | 1 | 3 | 2 |
| 14 | 5 | 2 | 3 | 1 | 2 | 1 | 3 |
| 15 | 5 | 3 | 1 | 2 | 3 | 2 | 1 |
| 16 | 6 | 1 | 3 | 2 | 3 | 1 | 2 |
| 17 | 6 | 2 | 1 | 3 | 1 | 2 | 3 |
| 18 | 6 | 3 | 2 | 1 | 2 | 3 | 1 |

[Fig. 13]
L18-1
[Fig. 14]
L18-2
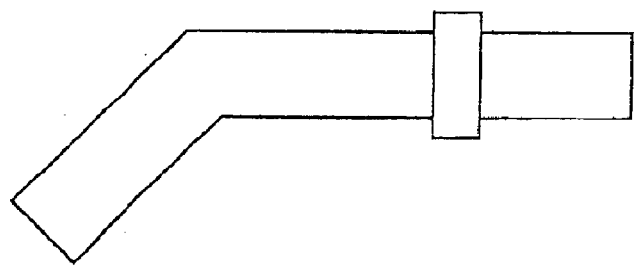
[Fig. 15]
L18-3
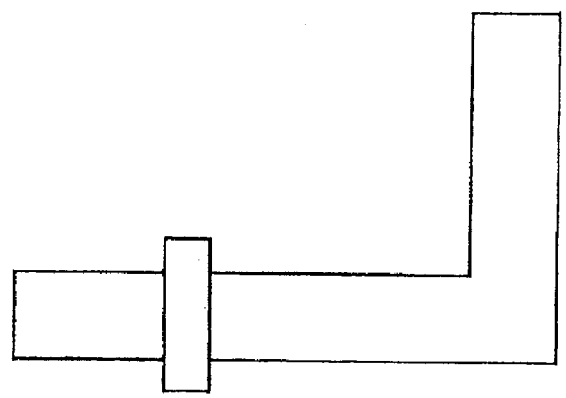

[Fig. 16]
L18-4
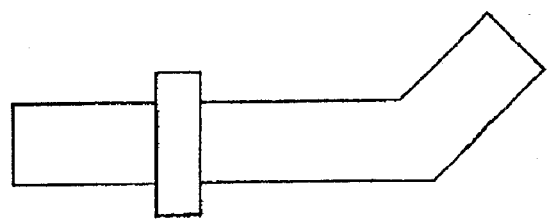
[Fig. 17]
L18-5
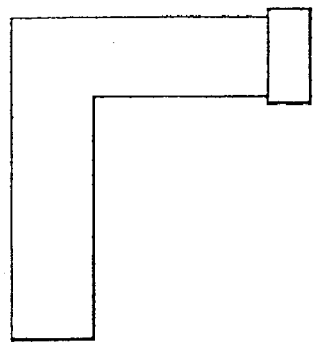
[Fig. 18]
L18-6
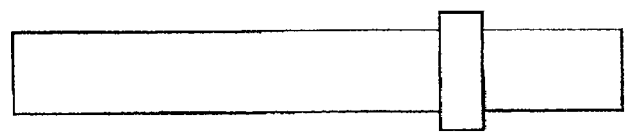

[Fig. 19]
L18-7
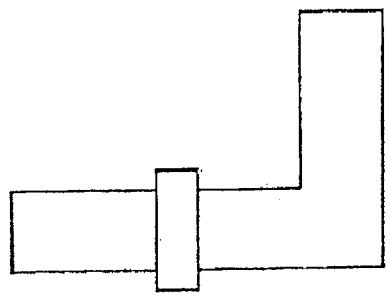
[Fig. 20]
L18-8
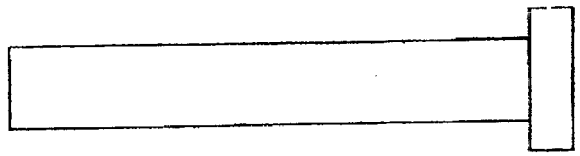
[Fig. 21]
L18-9
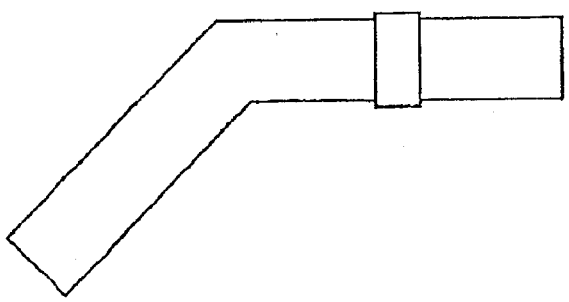

[Fig. 22]
L18-10
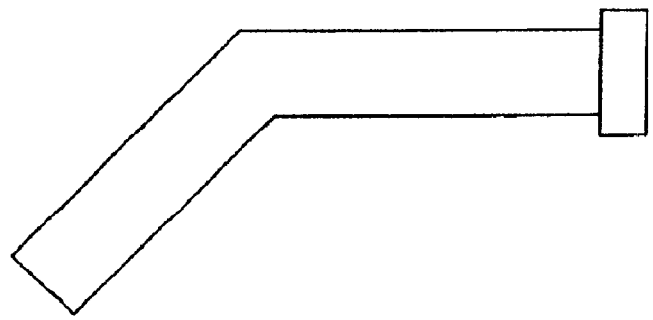
[Fig. 23]
L18-11
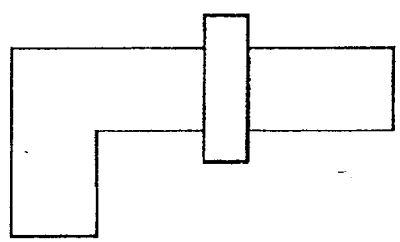
[Fig. 24]
L18-12
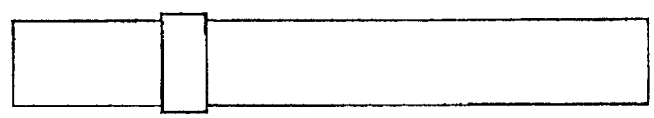

[Fig. 25]
L18-13
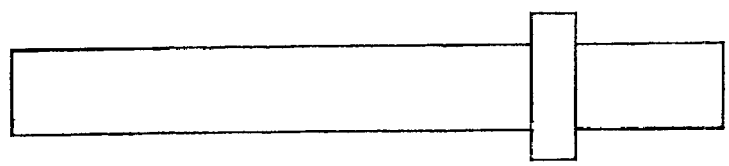
[Fig. 26]
L18-14
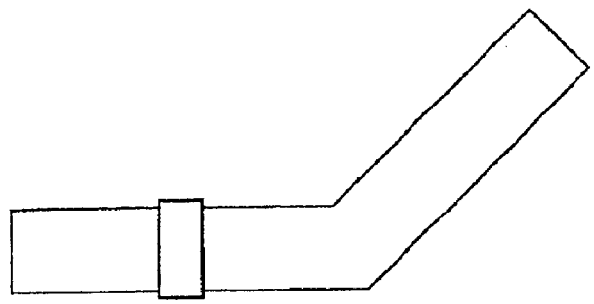
[Fig. 27]
L18-15
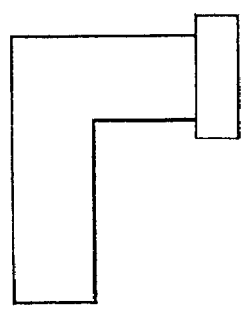

[Fig. 28]
L18-16
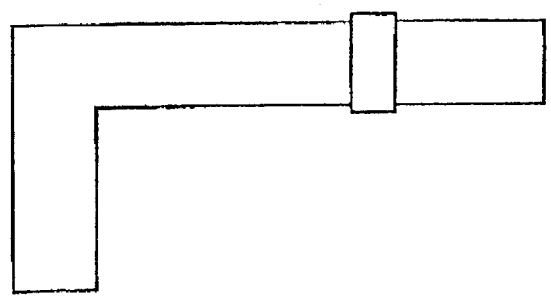
[Fig. 29]
L18-17
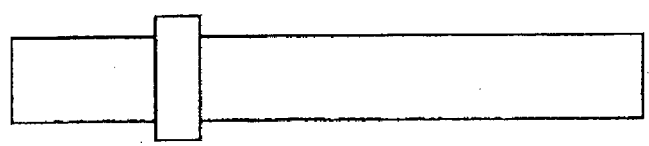
[Fig. 30]
L18-18
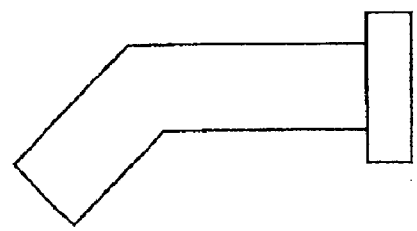

[Fig. 31]

| EXPERIMENTAL No. | AIRFLOW RATE (m³/min) | | | NOISE LEVEL [dB(A)] | | |
|---|---|---|---|---|---|---|
| | FAN ROTATIONAL SPEED (rpm) | | | FAN ROTATIONAL SPEED (rpm) | | |
| | 1983 | 2200 | 2574 | 1983 | 2200 | 2574 |
| L18-1 | 0.347 | 0.396 | 0.488 | 52.7 | 55.5 | 60.3 |
| L18-2 | 0.356 | 0.406 | 0.479 | 46.9 | 49.9 | 54.7 |
| L18-3 | 0.300 | 0.337 | 0.409 | 41.8 | 44.8 | 49.5 |
| L18-4 | 0.329 | 0.371 | 0.424 | 44.0 | 46.8 | 51.3 |
| L18-5 | 0.320 | 0.370 | 0.439 | 45.8 | 48.9 | 53.1 |
| L18-6 | 0.324 | 0.359 | 0.424 | 45.4 | 48.5 | 53.3 |
| L18-7 | 0.300 | 0.334 | 0.382 | 43.8 | 46.7 | 50.9 |
| L18-8 | 0.389 | 0.436 | 0.505 | 47.5 | 50.5 | 55.1 |
| L18-9 | 0.294 | 0.332 | 0.398 | 44.7 | 47.5 | 52.1 |
| L18-10 | 0.386 | 0.426 | 0.502 | 49.9 | 52.8 | 57.5 |
| L18-11 | 0.330 | 0.366 | 0.446 | 45.7 | 49.0 | 53.3 |
| L18-12 | 0.337 | 0.386 | 0.452 | 48.8 | 51.7 | 56.5 |
| L18-13 | 0.340 | 0.386 | 0.452 | 44.6 | 47.8 | 52.9 |
| L18-14 | 0.356 | 0.396 | 0.479 | 47.0 | 49.8 | 54.7 |
| L18-15 | 0.376 | 0.406 | 0.498 | 50.6 | 53.6 | 58.1 |
| L18-16 | 0.333 | 0.376 | 0.442 | 44.5 | 47.7 | 52.3 |
| L18-17 | 0.327 | 0.373 | 0.436 | 47.4 | 50.2 | 55.1 |
| L18-18 | 0.403 | 0.455 | 0.548 | 52.8 | 55.9 | 60.5 |

[Fig. 32]
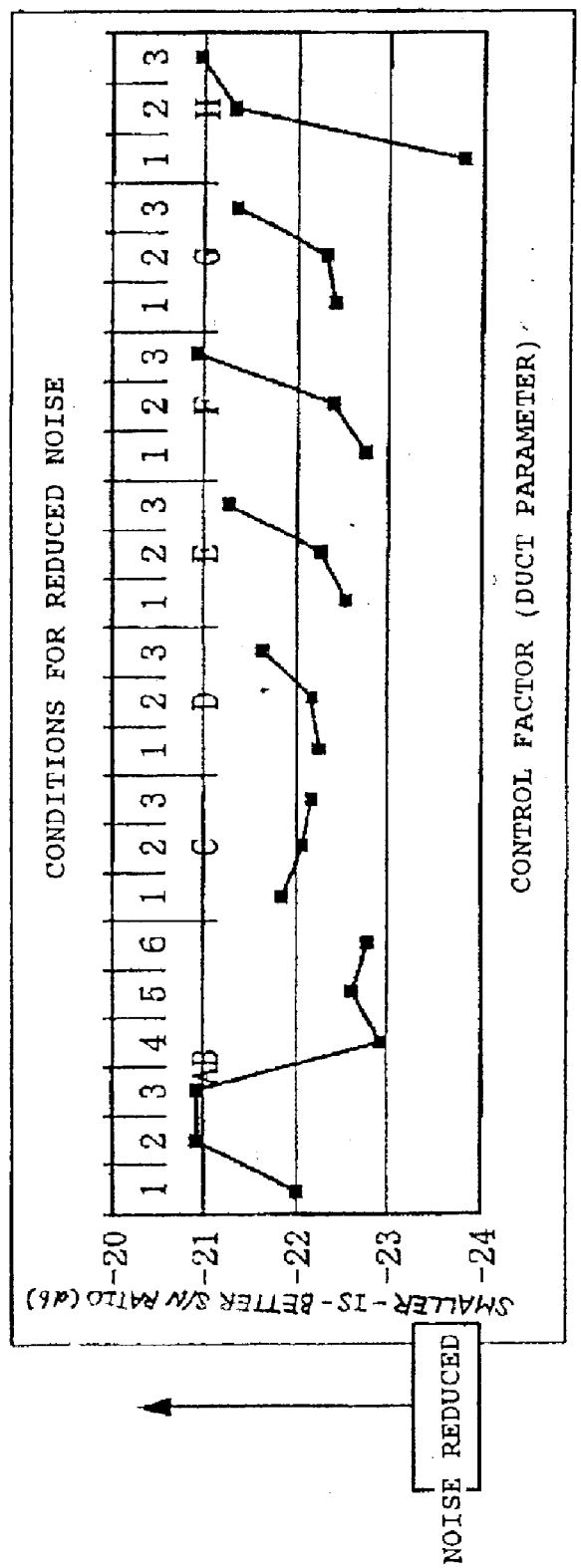

[Fig. 33]
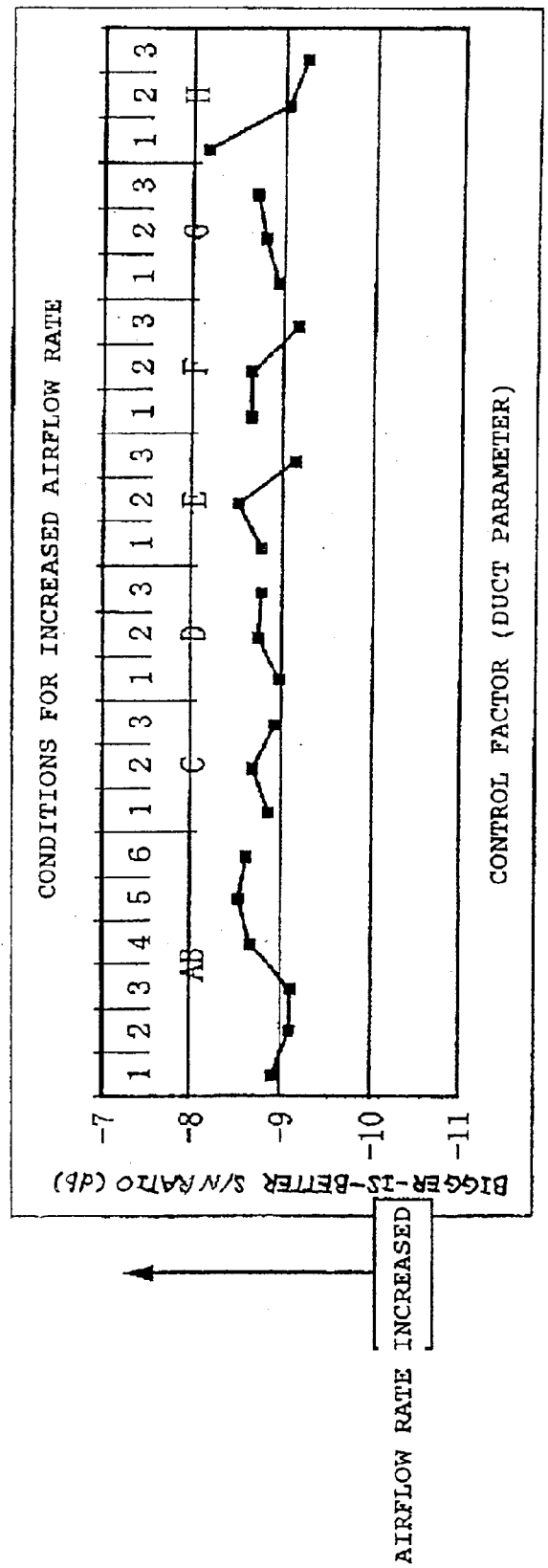

[Fig. 34]
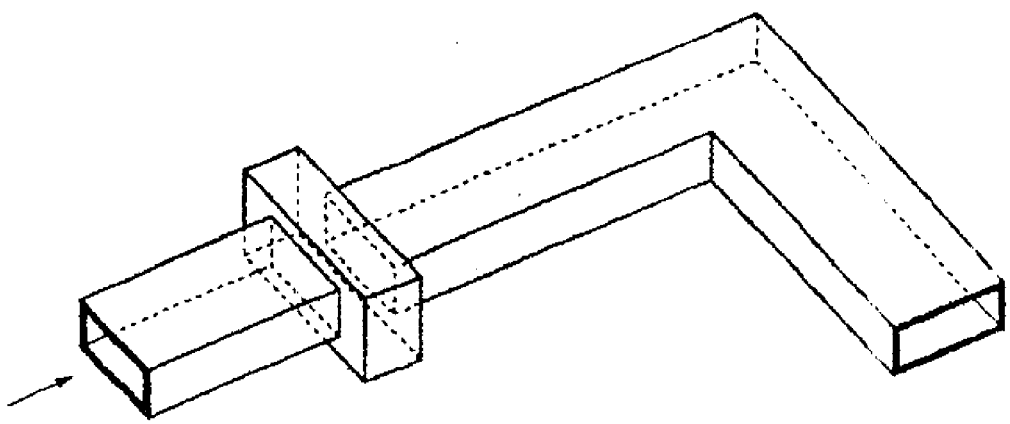
[Fig. 35]
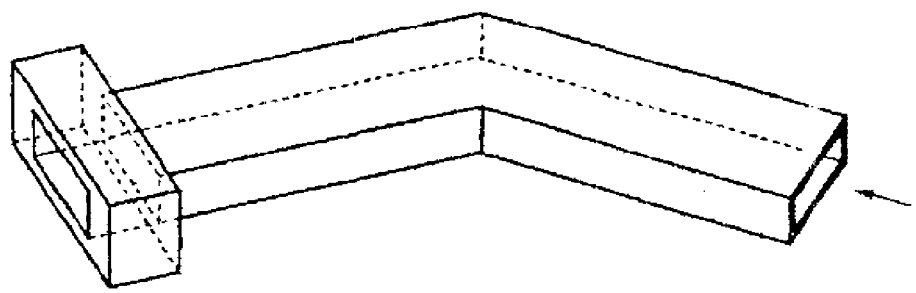

[Fig. 36]
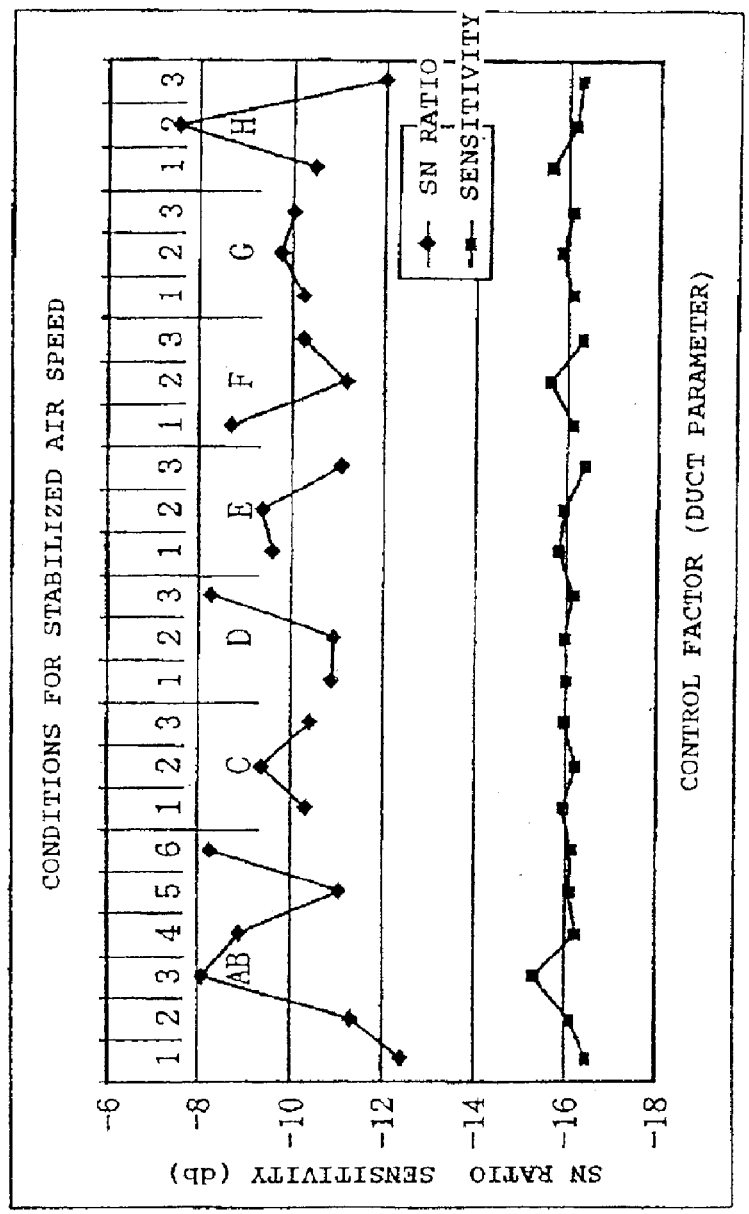
INCREASED SN RATIO = AIR SPEED IN EXHAUST SIDE IS STABLE RELATIVE TO POWER CONSUMPTION
INCREASED SENSITIVITY = INCRESED AIR SPEED (INCRESED AIR SPEED IS OBTAINED WITH SMALLER POWF

[Fig. 37]
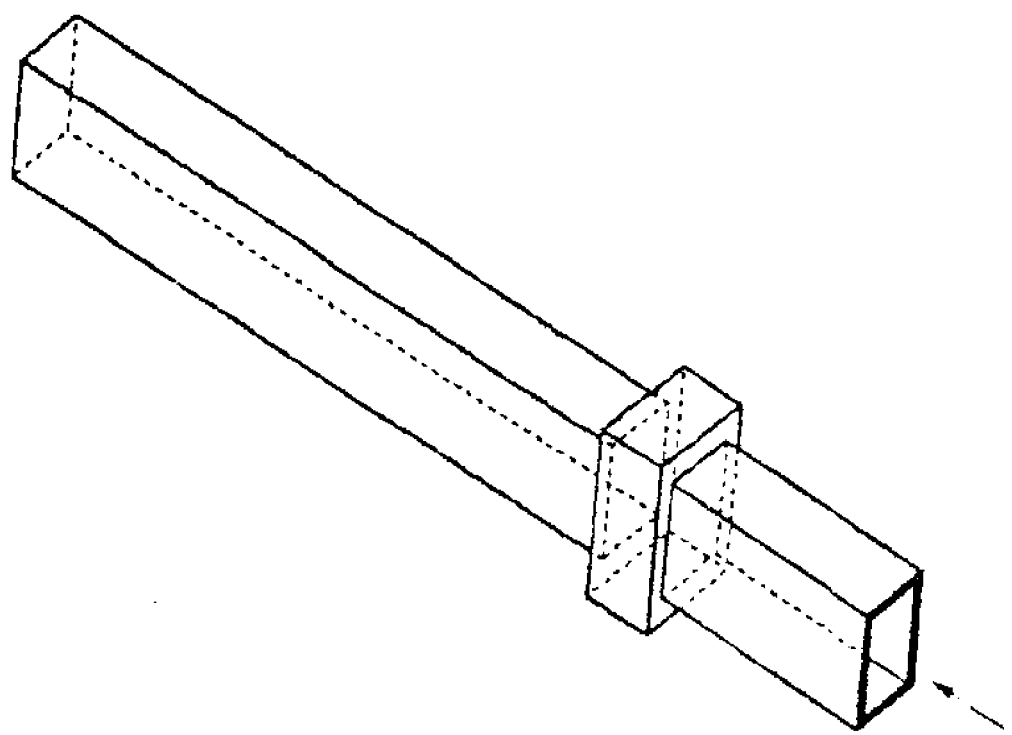

[Fig. 38]

MEASURED VALUES IN CONFIRMATION EXPERIMENT

| | A/B SPONGE | C FIX | D EXHAUST LENGTH | E INTAKE LENGTH | F ANGLE | G MUFFLER SHAPE | H MUFFLER POSITION | ERROR FACTOR | FAN ROTATIONAL SPEED rpm | NOISE LEVEL dB(A) | AIRFLOW RATE m³/min |
|---|---|---|---|---|---|---|---|---|---|---|---|
| OPTIMUM CONDITIONS FOR INCREASED AIRFLOW RATE | PART (THICK) | WEIGHT EXHAUST | ORDINARY | ORDINARY | 135 | 3 | EXHAUST PORT | NONE (EXHAUST PORT IS NOT OBSTRUCTED) | 1983 | 51.3 | 0.4125 |
| | | | | | | | | | 2200 | 54.4 | 0.4620 |
| | | | | | | | | | 2574 | 59.2 | 0.5478 |
| | | | | | | | | YES (HALF OF EXHAUST PORT IS OBSTRUCTED) | 1983 | 52.6 | 0.3465 |
| | | | | | | | | | 2200 | 55.4 | 0.3927 |
| | | | | | | | | | 2574 | 59.8 | 0.4587 |
| OPTIMUM CONDITIONS FOR REDUCED NOISE LEVEL | ENTIRE (THICK) | FREE | LARGE | LARGE | 90 | 3 | INTAKE SIDE | NONE (EXHAUST PORT IS NOT OBSTRUCTED) | 1983 | 39.1 | 0.2705 |
| | | | | | | | | | 2200 | 42.3 | 0.3050 |
| | | | | | | | | | 2574 | 46.6 | 0.3660 |
| | | | | | | | | YES (HALF OF EXHAUST PORT IS OBSTRUCTED) | 1983 | 41.4 | 0.2546 |
| | | | | | | | | | 2200 | 44.2 | 0.2811 |
| | | | | | | | | | 2574 | 48.2 | 0.3342 |
| OPTIMUM CONDITIONS FOR STABILIZED AIR SPEED | ENTIRE (THICK) | WEIGHT EXHAUST | LARGE | SMALL | 180 | 2 | EXHAUST SIDE | NONE (EXHAUST PORT IS NOT OBSTRUCTED) | 1983 | 43.8 | 0.3156 |
| | | | | | | | | | 2200 | 47.0 | 0.3501 |
| | | | | | | | | | 2574 | 51.8 | 0.4270 |
| | | | | | | | | YES (HALF OF EXHAUST PORT IS OBSTRUCTED) | 1983 | 46.5 | 0.2917 |
| | | | | | | | | | 2200 | 49.4 | 0.3182 |
| | | | | | | | | | 2574 | 53.8 | 0.3845 |
| INITIAL CONDITIONS (L18-1) | NONE | FREE | SMALL | SMALL | 180 | 1 | EXHAUST PORT | NONE (EXHAUST PORT IS NOT OBSTRUCTED) | 1983 | 52.7 | 0.3470 |
| | | | | | | | | | 2200 | 55.5 | 0.3960 |
| | | | | | | | | | 2574 | 60.3 | 0.4884 |
| | | | | | | | | YES (HALF OF EXHAUST PORT IS OBSTRUCTED) | 1983 | 55.3 | 0.3267 |
| | | | | | | | | | 2200 | 58.2 | 0.3696 |
| | | | | | | | | | 2574 | 62.6 | 0.4257 |

[Fig. 39]

TABULATION OF CONFIRMATION EXPERIMENT

| | EFFECT BY INCREASED AIRFLOW RATE (AIRFLOW RATIO) | | | | SOUND ABSORBING EFFECT (NOISE LEVEL DIFFERENCE(dB(A))) | | | |
|---|---|---|---|---|---|---|---|---|
| | 1983rpm | 2200rpm | 2574rpm | AVERAGE EFFECT | 1983rpm | 2200rpm | 2574rpm | AVERAGE EFFECT |
| OPTIMUM CONDITIONS FOR INCREASED AIRFLOW RATE | 1.19 | 1.17 | 1.12 | 1.16 | -1.4 | -1.1 | -1.1 | -1.2 |
| OPTIMUM CONDITIONS FOR REDUCED NOISE LEVEL | 0.78 | 0.77 | 0.75 | 0.77 | -13.6 | -13.2 | -13.7 | -13.5 |
| OPTIMUM CONDITIONS FOR STABILIZED AIR SPEED | 0.91 | 0.88 | 0.87 | 0.89 | -8.9 | -8.5 | -8.5 | -8.6 |
| INITIAL CONDITIONS (L18-1) | 1 | 1 | 1 | 1 | 0 | 0 | 0 | 0 |

※ COMPARISON IN CONDITIONS NOT INCLUDING ERROR FACTOR

[Fig. 40]

NOISE LEVEL COMPARISON BY DUCT MATERIAL

| | | | FAN ROTATIONAL SPEED (rpm) | | | AVERAGE | EFFECT |
|---|---|---|---|---|---|---|---|
| | | | 1983 | 2200 | 2547 | | |
| MATERIAL | SHEET MEMBER | L18-3 SHAPE | 41.8 | 44.8 | 49.5 | 46.9 | 10.8 |
| | | L18-13 SHAPE | 44.6 | 47.8 | 52.9 | | |
| | ACRIL | L18-3 SHAPE | 53.5 | 56.2 | 60.5 | 57.7 | - |
| | | L18-13 SHAPE | 55.6 | 57.9 | 62.6 | | |

NOISE LEVEL COMPARISON BY DUCT THICKNESS

| | | FAN ROTATIONAL SPEED (rpm) | | | AVERAGE | EFFECT |
|---|---|---|---|---|---|---|
| | | 1983 | 2200 | 2547 | | |
| THICKNESS | 2.0mm ACRIL | 54.5 | 57.7 | 62.0 | 58.1 | - |
| | 0.5mm THIN PLASTIC | 50.9 | 54.1 | 59.1 | 54.7 | 3.4 |
| | 0.25mm SHEET MEMBER | 51.0 | 54.3 | 59.1 | 54.8 | 3.3 |

[dB(A)]

[Fig. 43]
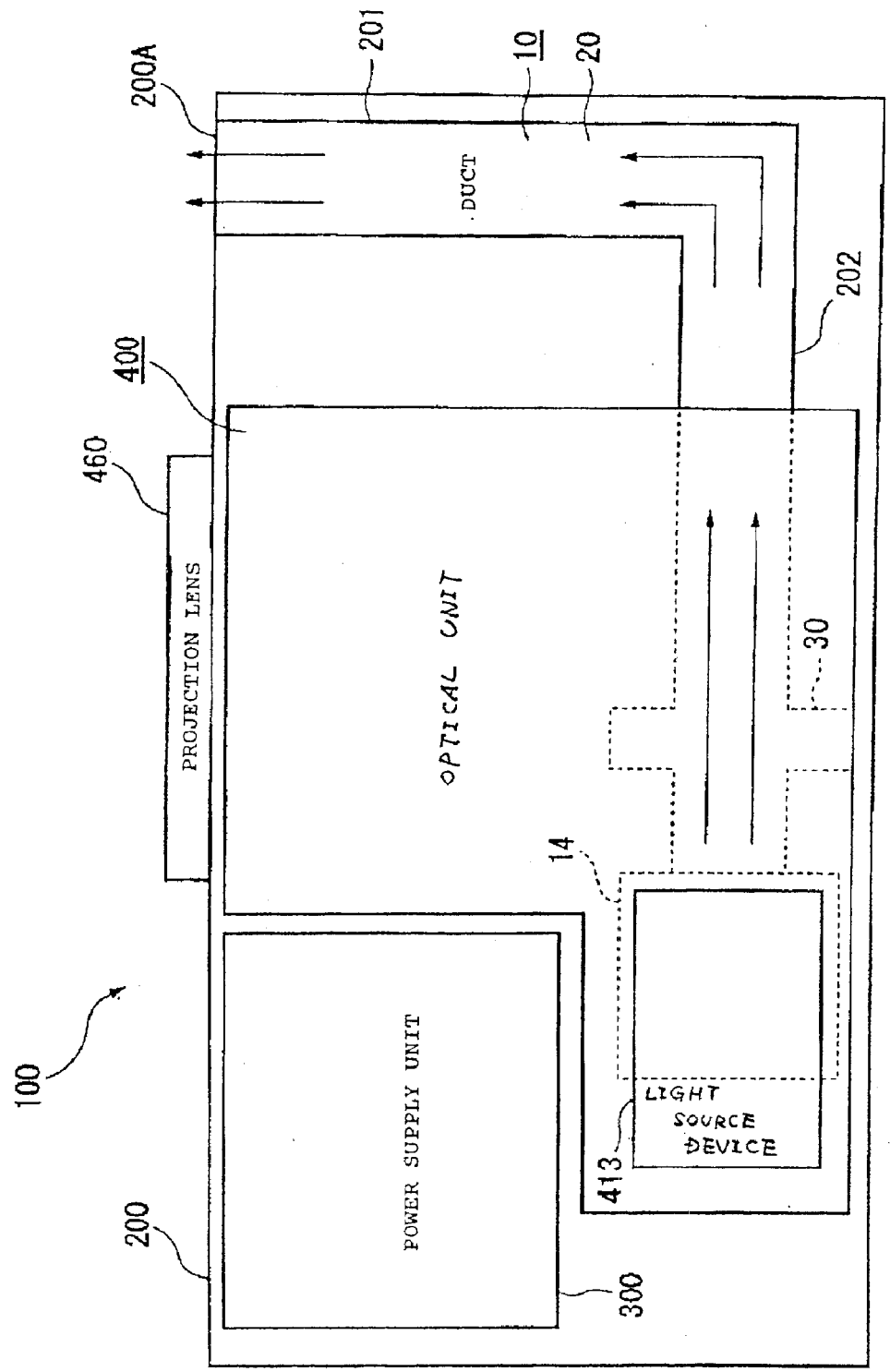

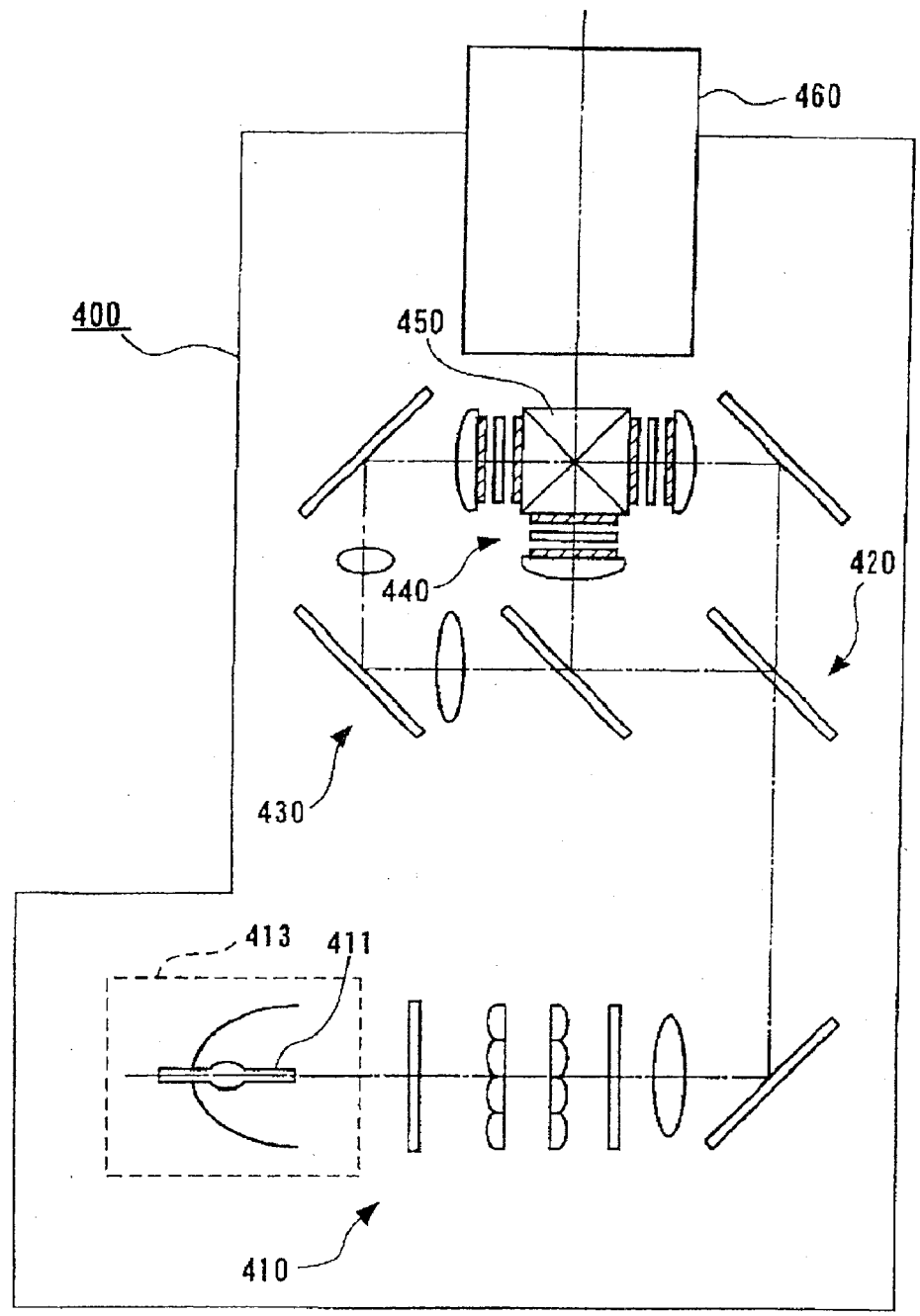
[Fig. 44]

DUCT AND ELECTRONIC APPARATUS HAVING THE DUCT

BACKGROUND OF THE INVENTION

1. Field of Invention

The present invention relates to a duct and an electronic apparatus having the duct.

2. Description of Related Art

Currently, projectors are being used that include a light source, an electro-optical device for modulating a luminous flux emitted from the light source according to image information so as to form an optical image, a projection optical system for projecting and magnifying the optical image formed by the electro-optical device, and a casing for accommodating these elements therein. Such a projector, in addition to displaying presentations in a meeting, academic conference, exhibition, and the like, can also be used for a household home theater and the like. Therefore, there have been approaches for increasing brightness of the light source in order to enable the image projected by the projector to have higher quality with greater sharpness.

When the brightness of the light source is increased here, cooling efficiency of optical elements including the electro-optical device is required to increase in order to prevent the inside of the apparatus from being excessively heated. Therefore, the projector can be provided with an intake fan arranged in the vicinity of optical elements including the electro-optical device and a duct, which is connected to the intake fan and arranged to face an exhaust port formed in the casing, so as to improve the cooling efficiency by increasing the size of the intake fan.

SUMMARY OF THE INVENTION

However, the method of improving the cooling efficiency by simply increasing the size of the fan in response to the increased brightness of the light source in such a manner involves the following problems. Specifically, there can be a problem that when the size of the fan is increased, the airflow rate and air velocity of cooled air are increased, and the cooled air hit against the duct, producing wind noise, so that the projector is liable to be noisy. When the intake fan is arranged along the casing of the projector, in addition to the wind noise, the operating noise of the intake fan itself increases as the fan become large, so that there is also another problem that the noise is further increased. Such problems become further outstanding especially when the projector is used in a home or the like, because the distance between the projector and a user is decreased.

In addition, such problems are not limited to the projector. Similar problems can exist in other electronic apparatuses, such as game machines.

The present invention can provide a duct with a high sound absorbing effect and maintaining sufficient exhausting efficiency and an electronic apparatus having the duct.

A duct according to the present invention, which is connected to a fan, can include a material made of a fiber sheet impregnated with a synthetic resin. It should be understood the fan is not specifically limited, however, a sirocco fan, for example, may be preferable because of an advantage that an adequate discharge pressure can be secured at a predetermined rotational speed. Furthermore, the fan may be an intake fan to be connected to an intake port of the duct or may be an exhaust fan to be connected to an exhaust port of the duct.

As the fiber sheet, various sheets made by binding fiber, including paper, non-woven fabric, and a heatproof sheet, may be adopted. Paper is made by intertwining plant fibers or other fibers together so as to be agglutinated. As raw materials of the paper, not only plant fiber can be used generally, but also viscose rayon, acetyl cellulose, synthetic fiber, and a synthetic polymer may be adopted. As non-woven fabric, general non-woven fabric may be adopted, which is made by various manufacturing methods such as spunbonding, melt-blowing, flash spinning, tow filamentation, and a burst-fiber method.

In such a duct, under conditions that an intake fan is connected to the intake port of the duct, for example, and the rotational speed of the fan is to be a predetermined value (2200 rpm, for example), noise levels [dB (A)] in the vicinity of the exhaust port are measured as measured characteristics. When the duct shape is straight, the measured characteristic value in the vicinity of the exhaust port reduces by at least approximately 3 dB (A) in comparison with that of a duct made of a general synthetic resin. When the duct is provided with an inflection section arranged in an intermediate part thereof, the measured characteristic value reduces by at least approximately 11 dB (A). The noise level [dB (A)] is an A-characteristic value among auditory-sensation weighted sound-pressure levels measured by a noise meter, which corresponds to human audibility to the utmost. Accordingly, according to the first invention, sound-absorbing effect of the duct can be improved while maintaining sufficient exhausting efficiency.

Also, the fiber sheet may be preferably paper. In such a manner, since the sheet member is mainly formed of paper, manufacturing cost can be reduced in comparison with the case of that being formed of a synthetic resin. Also, when the ratio of the paper in the sheet member is 51% or more, the duct can be recycled as recyclable paper when the duct is wasted. Therefore, the recycling of the duct is facilitated. Moreover, the raw material cost can be reduced in comparison with that when non-woven fabric or a heatproof sheet is adopted as the fiber sheet, and sufficient rigidity can also be secured.

The thickness of the sheet member is preferably less than 2 mm, and it is more preferably 0.5 mm or less. For example, when the duct is formed to have a thickness of 2 mm or more, in addition to a small sound-absorbing effect, there are shortcomings that duct-manufacturing cost is increased due to increase in the amount of materials constituting the sheet member to be used, and the duct size is also increased.

On the other hand, when air vibration is produced, the surfaces forming the duct are deflected, and the duct absorbs the vibration accompanied by noise by having the thickness of the sheet member be 0.5 mm or less, so that the sound absorbing effect is improved.

It is preferable that the synthetic resin is polymethylpentene and deep drawing is performed on an intermediate part of duct passage so as to reduce the cross-sectional airflow area. As the degree of the deep drawing, when the duct is arranged in a casing of an electronic apparatus, for example, in consideration of an arrangement space, the duct may be formed so as to have a cone angle of at least 6°, approximately.

When the sheet member is formed of polymethylpentene as a synthetic resin in such a manner, since polymethylpentene is hardly melted by heat of the high-temperature air flowing inside the duct, the shape retention of the duct can be sufficiently secured even at the high temperature. At this time, deep drawing can be performed on the sheet member, including polymethylpentene, so as to have the degree mentioned above. Accordingly, when arranged in an electronic apparatus, the duct can be simply configured matching the shape of a space in the electronic apparatus, thereby improving the degree of freedom in designing the duct.

A duct according to the present invention, which is connected to a fan at one of an intake port and an exhaust port, can include a single synthetic resin having a thickness of less than 2 mm and capable of reducing the measured characteristic value by at least 3 dB. At this time, the thicknesses of 0.5 mm or less may be more preferable. As the measured characteristics, the noise level in the vicinity of the exhaust port may be adopted.

As the synthetic resin, a polyolefine resin, polyester resin, and polyamide resin, and the like may be adopted. As the polyolefine resin, polypropylene or polyethylene as a homopolymer and an ethylene-α-olefine copolymer or propylene-α-olefine copolymer may be adopted. As the polyester resin, a homopolyester such as polyethylene terephthalate, copolyester having the homopolyester as a principal ingredient copolymerized with other ingredients, and further mixed polyester of these polyesters may be adopted. As the polyamide resin, nylon 6 (polycaprolactamide) or nylon 6,6 (polyhexamethyleneadipamide) may be adopted.

For example, when the duct is formed to have a synthetic-resin thickness of 2 mm or more, in addition to a small sound absorbing effect, there is a disadvantage that duct-manufacturing cost is increased due to increase in the amount of materials constituting the sheet member to be used.

On the other hand, when air vibration is produced, the surfaces forming the duct are deflected, and the duct suppresses the vibration by having the thickness of the synthetic resin be 0.5 mm or less, so that the sound absorbing effect is improved.

An inflated section having a cross-sectional area larger than a cross-sectional area of the other section may be arranged at an intermediate part of a duct passage. At this time, preferably, the cross-sectional area of the inflated section is larger by approximately 1.5 times than that of the other section.

A cross-sectional shape of the duct may be any shape such as a rectangle, a square, a triangle, and a circle. A cross-sectional shape of the inflated section is preferably the same shape with the cross-sectional shape of the duct. However, when the cross-sectional shape of the duct and inflated section is a circle or an ellipse in the case of arranging the duct in a casing forming an electronic apparatus, a dead space can be produced between the casing and the duct/inflated section, which is not preferable in view of miniaturizing of the electronic apparatus. Therefore, the cross-sectional shape of the duct and inflated section may be preferably a shape having a corner such as a rectangle, square, and triangle. Among them, the cross-sectional shape of the duct and inflated section may be more preferably a triangle because curved portions of the casing can be utilized effectively to extend a space within the casing. Also, the inflated section may be formed to inflate only in a predetermined direction or to inflate in the entire directions from the duct.

The inflated section may preferably be arranged in the intake port side of the duct. The intake port side of the duct also means that the inflated section is provided at the intake port of the duct. The inflated section may be arranged in the intake port side from the center of the duct.

On internal surfaces of the duct and the inflated section, a sound-absorption member made of a porous material may preferably be arranged. The sound-absorption member made of a porous material is a porous substance having a sound absorbing effect due to the porous portion, and for it, a sponge made of a rubber or synthetic resin, rock wool, and glass wool, for example may be adopted.

Preferably, the duct is provided with an inflected section arranged at an intermediate part of a duct passage. The angle between duct parts facing each other across the inflected section an be less than 135°. The inflected section may more preferably be arranged substantially at the center of the duct.

Furthermore, when the duct is arranged within a casing of an electronic apparatus, the duct may preferably be arranged within the casing having the number of fixing portions between the duct and the casing as small as possible. For example, the spongy material may be arranged between the duct and the casing, so that the duct and the casing may not be partly fixed together.

According to the above invention, for example, under conditions that a fan is connected to the intake port of the duct, and the rotational speed of the fan is to be a predetermined value, noise levels (electric current values shown by a noise meter) in the vicinity of the exhaust port are measured, so that a duct with the minimum measured characteristic value (noise level) in the exhaust port can be manufactured. Also, by measuring an airflow rate as a measured characteristic value in the vicinity of the exhaust port, the duct can be confirmed to have sufficient exhausting efficiency. Thereby, the sound absorbing effect of the duct can be improved while the sufficient exhausting efficiency is maintained.

In addition, in a comparatively narrow and quiet place such as a home, when an electronic apparatus having such a duct is used, a design having the minimum noise level can be achieved as described above. However, in a comparatively large and noisy place such as a public space, when an electronic apparatus having such a duct is used, and the duct is designed to have a noise level slightly higher than that of the optimum design while it is lower than an ordinary level, the noise is masked by surrounding sound and a space, so that the duct may be designed to have a larger airflow rate by slightly sacrificing the noise level in order to improve cooling efficiency. Also, the duct may be designed to be applicable in both the home and the public space.

Such a duct according to the present invention is obtained by utilizing an experimental design (a technique of quality engineering). The experimental design (the technique of the quality engineering) is a specific technical method for simultaneously achieving both high quality and high productivity in a product design and is initiated by Mr. Genichi TAGUCHI as the so-called Taguchi Method. Evaluations according to such an experimental design (a technique of quality engineering) are also adopted by JIS standard and the technique is sufficiently reliable as a general evaluation method. In addition, as the JIS standard adopting the technique of the quality engineering, there are JIS Z8403-1996: General principle for determining quality characteristics-standard values and JIS K7109-1986: Method for determining size tolerances of plastic, for example.

An electronic apparatus according to the present invention can include the duct described above. According to the invention, the same advantages as those in the duct can be achieved, so that the electronic apparatus can be securely driven according to the specification thereof. At this time, even when the distance between the electronic apparatus and a user is comparatively small as when using the apparatus in a home, for example, sufficient quietness can be secured so as not to give a disagreeable feeling to the user.

BRIEF DESCRIPTION OF THE DRAWINGS

The invention will be described with reference to the accompanying drawings, wherein like numerals reference like elements, and wherein:

FIG. 1 includes drawings showing model ducts according to each of the embodiments of the present invention;

FIG. 2 is a drawing showing an L18 orthogonal table;

FIG. 3 includes drawings showing sponges with different thicknesses according to each of the embodiments;

FIG. 4 includes drawings showing the model ducts having weights arranged at different positions according to each of the embodiments;

FIG. 5 includes drawings showing the model ducts having different lengths between an inflected section and an exhaust port according to each of the embodiments;

FIG. 6 includes drawings showing the model ducts having different lengths between the inflected section and an inflated section according to each of the embodiments;

FIG. 7 includes drawings showing the model ducts having different angles between duct bodies across the inflected section according to each of the embodiments;

FIG. 8 includes drawings showing the model ducts having inflated sections with different sectional-area ratios to the sectional area of the duct body according to each of the embodiments;

FIG. 9 includes drawings showing the model ducts having the inflated sections with different positions relative to the duct body according to each of the embodiments;

FIG. 10 is a drawing showing summarized control factors according to each of the embodiments;

FIG. 11 is a drawing showing the control factors laid out on an L18 orthogonal table;

FIG. 12 is a drawing showing the control factors laid out on the L18 orthogonal table;

FIG. 13 is a plan view showing a duct of Experimental No. L18-1 according to each of the embodiments;

FIG. 14 is a plan view showing a duct of Experimental No. L18-2 according to each of the embodiments;

FIG. 15 is a plan view showing a duct of Experimental No. L18-3 according to each of the embodiments;

FIG. 16 is a plan view showing a duct of Experimental No. L18-4 according to each of embodiments;

FIG. 17 is a plan view showing a duct of Experimental No. L18-5 according to each of the embodiments;

FIG. 18 is a plan view showing a duct of Experimental No. L18-6 according to each of the embodiments;

FIG. 19 is a plan view showing a duct of Experimental No. L18-7 according to each of the embodiments;

FIG. 20 is a plan view showing a duct of Experimental No. L18-8 according to each of the embodiments;

FIG. 21 is a plan view showing a duct of Experimental No. L18-9 according to each of the embodiments;

FIG. 22 is a plan view showing a duct of Experimental No. L18-10 according to each of the embodiments;

FIG. 23 is a plan view showing a duct of Experimental No. L18-11 according to each of the embodiments;

FIG. 24 is a plan view showing a duct of Experimental No. L18-12 according to each of the embodiments;

FIG. 25 is a plan view showing a duct of Experimental No. L18-13 according to each of the embodiments;

FIG. 26 is a plan view showing a duct of Experimental No. L18-14 according to each of the embodiments;

FIG. 27 is a plan view showing a duct of Experimental No. L18-15 according to each of the embodiments;

FIG. 28 is a plan view showing a duct of Experimental No. L18-16 according to each of the embodiments;

FIG. 29 is a plan view showing a duct of Experimental No. L18-17 according to each of the embodiments;

FIG. 30 is a plan view showing a duct of Experimental No. L18-18 according to each of the embodiments;

FIG. 31 is a drawing showing the results of measuring the noise levels and airflow rates when the rotational speed of a motor is changed in the 18 experimental conditions according to each of the embodiments;

FIG. 32 is a factorial effect diagram when the measured characteristic is the noise level according to each of the embodiments;

FIG. 33 is a factorial effect diagram when the measured characteristic is the airflow rate according to each of the embodiments;

FIG. 34 is a drawing showing a duct shape having the optimum conditions for reducing the noise level according to each of the embodiments;

FIG. 35 is a drawing showing a duct shape having the optimum conditions for increasing the airflow rate according to each of the embodiments;

FIG. 36 is a factorial effect diagram when the measured characteristic is stabilizing of an airflow speed according to each of the embodiments;

FIG. 37 is a drawing showing a duct shape having the optimum conditions for stabilizing the airflow speed according to each of the embodiments;

FIG. 38 is a drawing showing the results of measuring the noise levels and airflow rates in each of the optimum conditions;

FIG. 39 is a summarized drawing of FIG. 38;

FIG. 40 is a drawing showing the results of measuring the noise levels when the material of the duct is changed according to each of the embodiments;

FIG. 41 is a drawing showing the results of measuring the noise levels when the thickness of the duct is changed according to each of the embodiments;

FIG. 43 is a schematic view of a projector according to the first embodiment of the present invention; and FIG. 44 is a schematic view of an optical unit of the projector.

DETAILED DESCRIPTION OF PREFERRED EMBODIMENTS

Figure 42A:
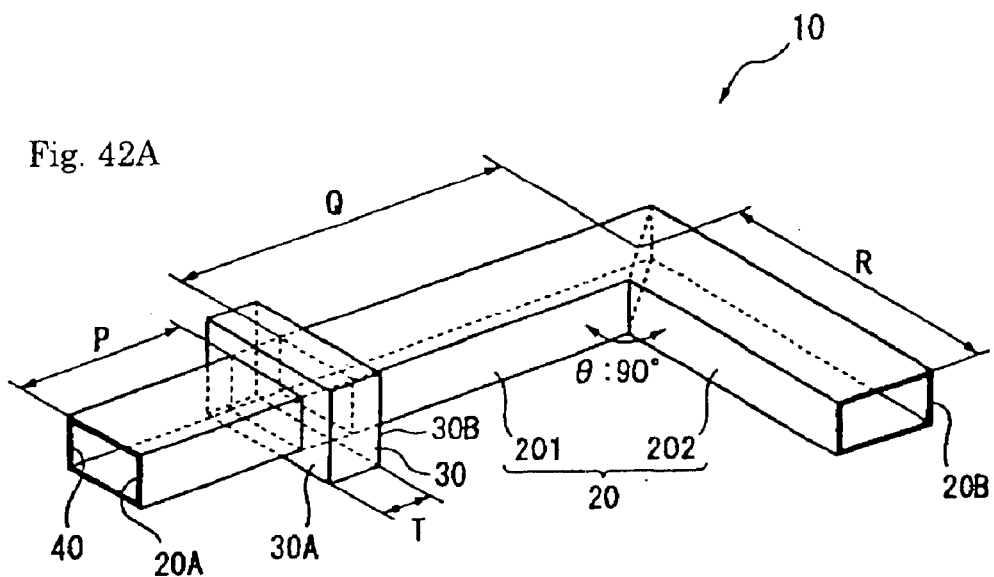
FIGS. 42(a)–(c) are perspective views of a duct according to a first embodiment of the present invention.

A duct according to the present invention is studied out by experiments according to the experimental design by Mr. TAGUCHI as mentioned above. A design procedure associated with a duct configuration will be described below.

As described above, in order to design a duct with a high sound absorbing effect, a noise level at an exhaust port of the duct may be measured. However, extremely small airflow rate exhausted from the exhaust port does not allow effective cooling to be performed, even if the duct is arranged in an electronic apparatus, such as a projector, so as to cool optical elements such as a light source. Then, as measured characteristic values, a noise level (dB (A)) and airflow rate ($m^3$/min) in the vicinity of the exhaust port of the duct are adopted.

For measuring these characteristic values, the following four items are prepared. First, a sirocco fan 14 (see FIG. 5), such as model TYF200 made by TOTO KIKI LTD is prepared as an intake fan for connecting to an intake port. Second, a microphone with a wind screen is prepared at a position 40 mm apart from the center of the open face of the exhaust port for detecting aerial vibration (noise) in the vicinity of the exhaust port. Third, a noise level meter is connected to the microphone for converting the aerial vibration (sound) detected by the microphone into a noise level as the measured characteristic so as to be output.

Fourth, in order to measure the airflow rate in the vicinity of the exhaust port, anemometers are arranged in vicinities of the left side, the center, and the right side of the exhaust port. As the anemometer, an anemometer model Testvento400 and a vane-type sensor PN 06359540, which are made by Testoterm Messtechnik GmbH & Co., may be used.

When the duct is used in an optical apparatus, such as a projector, the cooling efficiency may need to be increased by increasing the rotational speed of the fan, depending on an excessively heated state of the light source, etc. Also, the exhaust port for exhausting the air after cooling the optical apparatus, such as the projector may be obstructed with an object placed thereto. Accordingly, adopted as outside factors are the rotational speed of a fan motor (a signal factor M) and that the exhaust port is obstructed or not (an error factor).

Specifically, the rotational speed of a motor of the scirocco fan is set as the signal factor M, and the range of inputting the rotational speed of the motor includes 3 levels (M1: 1983 rpm, M2: 2200 rpm, and M3: 2574 rpm). The error factor has 2 levels in that half of the exhaust port of the duct is obstructed and the exhaust port is not obstructed.

As control factors capable of reducing the noise level in the vicinity of the exhaust port, the following can be assumed: the presence or absence of a sponge (A); the thickness of the sponge (B); the fixing of a duct (C); the length of the duct in the exhaust port side (the exhaust length D); the length of the duct in the intake port side (the intake length E); the angle between ducts across an inflected section (F); the area ratio of the inflated section to the duct body (a muffler shape G); and the position of the inflated section relative to the duct body (a muffler position H).

Then, model ducts 1 and 101 shown in FIGS. 1(A) and 1(B) are studied as design models that correspond to these control factors.

As shown in FIG. 1(A), the model duct 1 is assumed to include a hollow duct body 2 with a rectangular cross-section, an inflated section 3 arranged in an intermediate part of a duct passage of the duct body 2, and a sponge 4 to be bonded on internal surfaces of the duct body 2 and the inflated section 3 as a porous sound-absorption member.

The duct body 2, assuming an inflected section to be arranged in a part of the duct passage, can include an intake-port side duct body 21 having an open part that may be an intake port 2A and an exhaust-port side duct body 22 having an open part that may be an exhaust port 2B. At the inflected section, the angle θ between the intake-port side and exhaust-port side duct bodies 21 and 22 is denoted to be θ°.

The inflated section 3 is hollow and has a rectangular cross-section in line with the cross-section of the duct body 2.

The model duct 1 assumes that inflated section 3 to be arranged in the intake-port side duct body 21, in the exhaust-port side duct body 22, the length L1A between the exhaust port 2B and the inflected section is denoted to be L1A mm. The length L2A between the exhaust-port side face 3B of the inflated-section 3 and the inflected section is denoted to be L2A mm.

On the other hand a model duct 101 is assumed to have having the inflated section 3 arranged in the exhaust-side duct body 22, as shown in FIG. 1(B). In addition, description will be made where the same reference characters designate the components common to those of the model duct 1.

As shown in FIG. 1(B), in the model duct 101, the length L1B between the intake-port side face 3A of the inflated-section 3 and the inflected section is denoted to be L1B mm. The length L2B between the intake port 2A and the inflected section is denoted to be L2B mm.

That is, when the lengths L1A and L1B are expressed as a length L1 by rearranging them together, in the case that the inflated section 3 is arranged in the exhaust-port side duct body 22, the length L1 represents the length L1B between the inflected section and the intake-port side-face 3A of the inflated-section 3 (FIG. 1(B)). On the other hand, in the case that the inflated section 3 is not arranged in the exhaust-port side duct body 22, the length L1 represents the length L1A between the inflected section and the exhaust port 2B (FIG. 1(A)).

Also, when the lengths L2A and L2B are expressed as a length L2 by rearranging them together, in the same manner as in the length L1, in the case that the inflated section 3 is arranged in the intake-port side duct body 21, the length L2 represents the length L2A between the inflected section and the exhaust side-face 3B of the inflated-section (FIG. 1(A)). On the other hand, in the case that the inflated section 3 is not arranged in the intake-port side duct body 21, the length L2 represents the length L2B between the inflected section and the intake port 2A (FIG. 1(B)).

Among these, as for the duct length in the exhaust port side (the exhaust length), the duct length in the intake port side (the intake length), the angle between ducts across the inflected section, and the area ratio of the inflated section to the duct body (the muffler shape), changes in measured characteristic values in association with numerical changes in control factors also need to be determined. Accordingly, an L18 orthogonal table, shown in FIG. 2, which can adopt 3 levels of each factor, is adopted.

Among the selected 8 control factors (A to H), the control factor A (the presence or absence of the sponge) and the control factor B (the thickness of the sponge) cause contradictions such as that the thickness of the absent sponge is large or small when simply laying out them in the L18 orthogonal table. Then, the first and second lines of the L18 orthogonal table are combined into lines of 6 levels as a control factor AB (the use of the sponge) so as to lay out the following conditions.

As the control factor AB, "the use of the sponge" can be adopted. As 6 levels (AB1 to AB6) of the control factor AB, the presence or absence, the thickness, and the bonding position of the sponge are adopted. The control factor is summarized below. In addition, sponges 11 and 12 with different thicknesses are shown in FIG. 3. The sponge 11 with a smaller thickness has the thickness of 2 mm, and the sponge 12 with a larger thickness has the thickness of 3 mm.

The control factor AB: the use of the sponge (the sponge).

The level 1 (AB1): none.

The level 2 (AB2): the entire internal surfaces of the model ducts 1 and 101 (see FIG. 1) are bonded with the sponge 11 with the smaller thickness.

The level 3 (AB3): the entire internal surfaces of the model ducts 1 and 101 (see FIG. 1) are bonded with the sponge 12 with the larger thickness.

The level 4 (AB4): only the internal surface of the inflated section 3 is bonded with the sponge 11 with the smaller thickness.

The level 5 (AB5): only the internal surface of the inflated section 3 is bonded with the sponge 12 with the larger thickness.

The level 6 (AB6): none (the same as the level 1).

As the control factor C, "the fixing of the duct" can be adopted. As 3 levels (C1 to C3) of the control factor C, the following conditions can be set up. In addition, as shown in FIG. 4, a model of the fixing of the duct can be made by arranging a weight 13 in the model ducts 1 and 101. Referring to FIG. 4, it is shown that the weight 13 is arranged in the model ducts 1 and 101 to have different positions.

The control factor C: the fixing of the duct (fixing).

The level 1 (C1): none (free).

The level 2 (C2): the weight 13 is arranged in the exhaust port side (the exhaust-port side fixing).

The level 3 (C3): the weight 13 is arranged in the intake port side (the intake-port side fixing).

As the control factor D, "the duct length in the exhaust port side (the exhaust length), i.e., the length L1 in FIGS. 1(A) and 1(B)" can be adopted. As 3 levels (D1 to D3) of the control factor D, the following conditions can be set up. In addition, the model ducts 1 and 101 having inflected sections arranged in parts and being different in the length between the inflected section and the exhaust port are shown in FIG. 5.

The control factor D: the duct length in the exhaust port side (the exhaust length).

The level 1 (D1): smaller (100 mm).

The level 2 (D2): ordinary (150 mm).

The level 3 (D3): larger (200 mm).

As the control factor E, "the duct length in the intake port side (the intake length), i.e., the length L2 in FIGS. 1(A) and 1(B)" can be adopted. As 3 levels (E1 to E3) of the control factor E, the following conditions can be set up. In addition, the model duct 1 having an inflected section arranged in an intermediate part and being different in the length between the inflected section and the inflated section arranged in the intake port side is shown in FIG. 6.

The control factor E: the duct length in the intake port side (the intake length).

The level 1 (E1): smaller (100 mm).

The level 2 (E2): ordinary (150 mm).

The level 3 (E3): larger (200 mm).

As the control factor F, "the angle between ducts across the inflected section, i.e., the angle θ in FIG. 1" can be adopted. As 3 levels (F1 to F3) of the control factor F, the following conditions can be set up. In addition, the model ducts 1 and 101 having inflected sections being different in the angle between duct bodies 21 and 22 across the inflected section are shown in FIG. 7.

The control factor F: the angle between ducts across the inflected section (the angle).

The level 1 (F1): 180°.

The level 2 (F2): 135°.

The level 3 (F3): 90°.

As the control factor G, "the area ratio of the inflated section" can be adopted. As 3 levels (G1 to G3) of the control factor G, the following conditions can be set up. The model ducts 1 and 101 having inflated sections 3 being different in the cross-sectional area ratio to the cross-sectional area of the duct body 2 are shown in FIG. 8.

The control factor G: the area ratio of the inflated section to the duct body (the muffler shape).

The level 1 (G1): 1.2 times the cross-sectional area of the duct body.

The level 2 (G2): 1.5 times the cross-sectional area of the duct body.

The level 3 (G3): 1.8 times the cross-sectional area of the duct body.

As the control factor H, "the arranged position of the inflated section relative to the duct body" can be adopted. As 3 levels (H1 to H3) of the control factor H, the following conditions can be set up. The model ducts 1 and 101 having inflated sections 3 being different in the arranged position relative to the duct body are shown in FIG. 9.

The control factor H: the arranged position of the inflated section relative to the duct body (the muffler position).

The level 1 (H1): at the exhaust port of the duct body.

The level 2 (H2): in the exhaust port side of the duct body (100 mm apart from the exhaust port).

The level 3 (H3): in the intake port side of the duct body (100 mm apart from the intake port).

A table in that the control factors are laid out and summarized is shown in FIG. 10. The 18 experimental conditions (L18-1 to L18-18), in which these control factors are laid out to be an L18 orthogonal table, are shown in FIGS. 11 and 12.

In the L18 orthogonal table shown in FIG. 12, the experimental-run No. 1 (L18-1), for example, may be shown as follows.

L18-1: AB1C1D1E1F1G1H1

That is, the duct in the experimental-run No. 1 (L18-1) indicates that the duct is formed at the level 1 of all the control factors (AB and C to H). In addition, the 17 other experimental conditions (L18-2 to L18-18) may also be shown as ABnCnDnEnFnGnHn with reference to the L18 orthogonal table shown in FIG. 12 in the same manner. The duct configurations according to the 18 experimental conditions (L18-1 to L18-18) are shown in FIGS. 13 to 30. In addition, in FIGS. 13 to 30, the intake port is shown in the left side or the lower part of the drawings while the exhaust port is shown in the right side or the upper part of the drawings.

In the 18 experimental conditions, when the motor rotational speed (the signal factor M) is changed to be 1983 rpm, 2200 rpm, and 2574 rpm, the noise level (overall, dB (A)) and airflow rate (unit: $m^3/min$) in each rotational speed are measured as measured characteristic values. The measured results are shown in FIG. 31.

On the basis of the data shown in FIG. 31, the measured results in the experimental-run No. 1 to 18 obtained for each control factor (AB and C to H) from the 3 measured data in each experimental condition are converted into S/N ratios showing the degree to which the data spread is small (functionality) so as to form factorial effect diagrams shown in FIGS. 32 and 33 for each control factor. In addition, FIG. 32 shows the diagram in that the measured characteristic is the noise level (the condition of the small noise); FIG. 33 shows the diagram in that the measured characteristic is the airflow rate (the condition of the large airflow rate). The S/N ratio also shows that with increasing the value thereof, the dispersion of measured results is reduced.

Referring to FIG. 32, the duct with the improved sound absorbing effect is examined.

In the control factor AB, the S/N ratios in the levels 2 and 3 are extremely increased. Both the levels 2 and 3 are cases in that the sponge is arranged in the entire duct, so that it is proved to be effective that the sponge is arranged on the entire internal surface of the duct.

In the control factor C, although there are few large differences between the levels, it is identified that the free duct is better than the duct fixed at the part thereof. However, the contribution to the sound absorbing effect is small.

In the control factor D, the S/N ratio in the level 3 is larger than those in the levels 1 and 2. Therefore, it is identified that the duct with the length L1 (the exhaust length) larger than 100 mm is more effective in sound absorbing.

Also, in the control factor E, the S/N ratio in the level 3 is extremely larger than those in the levels 1 and 2. Therefore, it is identified that the duct with the length L2 (the intake length) larger than 100 mm is effective in sound absorbing.

Also, in the control factor F, the S/N ratio in the level 3 is extremely larger than those in the levels 1 and 2. Therefore, it is identified that the duct with the angle θ between ducts across the inflected section being smaller than 135° is extremely effective in sound absorbing.

Also, in the control factor G, the S/N ratio in the level 3 is extremely larger than those in the levels 1 and 2. Therefore, it is identified that the duct is extremely effective in sound absorbing when the cross-sectional area of the inflated section 3 is larger than 1.5 times the cross-sectional area of the duct body 2.

On the other hand, in the control factor H, the S/N ratios in the levels 2 and 3 are extremely larger than that in the level 1. Therefore, it is identified that the duct is extremely effective in sound absorbing when the inflated section 3 is arranged in an intermediate part of the passage of the duct body 2 without arranging the inflated section 3 in the exhaust port part.

Among these control factors, it is identified that the control factor AB, the control factor F, and the control factor H, in which difference between the maximum and minimum values of the S/N ratio is large enough to be approximately 2 dB, especially have the most effect on the sound absorbing to the utmost.

From the study described above, the levels with the increased S/N ratio in each control factor are selected from FIG. 32 so as to have an optimum condition. That is, the optimum condition when the measured characteristic is the noise level (overall) is AB3C1D3E3F3G3H3. The duct configuration under this optimum condition is shown in FIG. 34.

On the other hand, also in FIG. 33, the same examination as that in FIG. 32 is performed associated with the increase in the airflow rate. In comparison with the case in FIG. 32, the range of S/N-ratio-variation between levels in each control factor is narrow, and there are few effective control factors. However, the control factors F and H have comparatively large variations.

In the control factor F, the S/N ratio in the level 3 is extremely smaller than those in the levels 1 and 2. Therefore, it is identified that the duct with the angle θ larger than 135° is effective in increase in the airflow rate.

On the other hand, in the control factor H, the S/N ratios in the levels 2 and 3 are extremely smaller than that in the level 1. Therefore, it is identified that the duct is extremely effective increasing the airflow rate when the inflated section 3 is arranged toward as close as possible to the exhaust port.

From the study described above, the levels with the most increased S/N ratio in each control factor are selected from FIG. 33 so as to have an optimum condition. That is, the optimum condition when the measured characteristic is increase in airflow rate is AB5C2D2E2F2G3H1. The duct configuration under this optimum condition is shown in FIG. 35.

Next, using factorial effect diagrams in FIGS. 32 and 33, a condition with sufficient sound absorbing effect while maintaining a predetermined airflow rate, i.e., the condition for stabilizing the airflow speed an be studied. The results are shown in FIG. 36 as a factorial effect diagram. In addition, when the S/N ratio is large, the airflow speed is stabilized.

From FIG. 36, the levels with the most increased S/N ratio in each control factor are selected so as to have an optimum condition. That is, the optimum condition for stabilizing the airflow speed is AB3C2D3E1F1G2H2. The duct configuration under this optimum condition is shown in FIG. 37.

Next, regarding the optimum condition for reducing the noise level, the optimum condition for increasing the airflow rate, the optimum condition for stabilizing the airflow speed, and the initial condition (L18-1), the confirmation experiments of the noise level and the airflow rate are performed in the cases that the error factor is added thereto and it is not added. The results are shown in FIG. 38 and the tabulation thereof is shown in FIG. 39.

Based on the above confirmation experiments, an effective duct for sound absorbing can include the following qualities:

1) The sponge is arranged on the entire internal surface of the duct.

2) The duct is not partly fixed.

3) The length of the duct is increased as large as possible.

4) The angle between ducts across the inflected section is 90°.

5) The inflated section having the cross-sectional area larger than that of the duct is arranged in an intermediate part of the duct passage.

6) The cross-sectional area of the inflated section is larger than 1.5 times that of the duct.

7) The inflated section is arranged in the exhaust port side of the duct.

An effective duct for increasing the airflow rate can include the following qualities:

1) The sponge is arranged on the inflated section.

2) The angle of the inflected section is larger than 90°.

3) The cross-sectional area of the inflated section is increased as large as possible.

4) The inflated section is arranged at the exhaust port.

An effective duct for stabilizing an airflow speed can include the following qualities:

1) The exhaust port is fixed.

2) The length of the duct body in the exhaust port side is increased as large as possible.

3) The length of the duct body in the intake port side is reduced to be as small as possible.

4) The angle of the inflected section of the duct approaches 180° as close as possible.

5) The inflated section is arranged in the exhaust port side.

In summary, from the study described above, for a duct assembled in an electronic apparatus used in a comparatively small space, such as a home, the design with extremely reduced the noise level in consideration of the points resulting in sound absorbing qualities is preferable.

On the other hand, for a duct assembled in an electronic apparatus used in a public space such as a meeting room and hall, the design is preferable, in which the efficiency for cooling internal devices is improved by increasing the airflow rate so as to improve the exhausting efficiency even by sacrificing the improvement of the noise level, in consideration of the points shown for increasing the airflow rate.

Also, in order to respond to any of these designs, the duct may be designed so as to satisfy both the noise level and airflow rate by stabilizing the airflow speed.

Next, the material of the duct effective in sound absorbing is examined.

Two shapes of L18-3 and L18-13 in the experiment are selected as the duct shape and acrylic plate and sheet member are alternately used as the duct material, and then each noise level is measured. The results are shown in FIG. 40. In addition, the acrylic plate used has a thickness of 3.0 mm. The sheet member used is a fiber sheet of paper impregnated (coated) with a synthetic resin containing polymethylpentene as a principal ingredient on the surface thereof. The sheet member has a thickness of 0.25 mm and a paper ratio of 51% or more, and when it is formed in the duct, the draw forming can be performed.

As shown in the table of FIG. 40, it is understood that the sound absorbing effect is improved by 10.8 dB (A) or more on average for each duct shape in the case of using the sheet member in comparison with the case of using the acrylic plate.

As the conclusion, the optimum material of the duct effective in sound absorbing is a paper-like sheet member rather than a solid body, such as a plastic.

Next, the thickness of the duct effective in sound absorbing is examined.

A straight duct is adopted, which as a duct shape, has an overall length of 300 mm and the same cross-sectional area as that of the duct described above, and the ducts with thicknesses of 2.0 mm, 0.5 mm, and 0.25 mm are prepared. The duct with the thickness of 2 mm is an acrylic plate. The duct with the thickness of 0.25 mm is the sheet member. The duct with the thickness of 0.5 mm is a thin plastic (Iupilon sheet N made by Mitsubishi Gas Chemical Company. Inc.). The noise level for each case is measured. The results are shown in FIG. 41.

As shown in the table of FIG. 41, it should be understood that the sound absorbing effect is not so large when the thickness is 2.0 mm. However, it has a sound absorbing advantage of at least 3 dB (A) when the thickness is below 2.0 mm, preferably not more than 0.5 mm.

As the conclusion, the optimum thickness of the duct effective in sound absorbing is below 2.0 mm.

Based on the stock of information described above, two embodiments of a duct having high sound absorbing advantages will be described.

First Embodiment

A duct 10 according to a first embodiment of the present invention, as shown in FIG. 42. The duct can include a hollow duct body 20, which is to be connected to a sirocco fan 14 (see FIG. 43) and has a rectangular cross-section, an inflated section 30, which is disposed in an intermediate part of a passage of the duct body 20 and has a cross-sectional area larger than that of the duct body 20, and a sponge 40 as a sound absorption material, which is to be bonded on internal surfaces of the duct body 20 and the inflated section 30 and is made of a porous material.

Figure 42B:
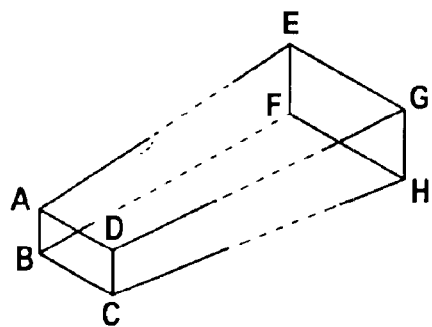
Figure 42C:
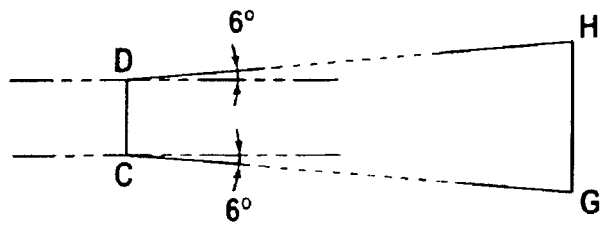

The duct body 20 and inflated section 30 can be made of a sheet member that is a fiber sheet of paper impregnated (coated) with a synthetic resin containing polymethylpentene, which is a polyolefine resin, as a principal ingredient on the surface thereof. The sheet member has a thickness of 0.25 mm and a paper ratio of 51% or more, and when being formed in the duct, the draw forming can be performed, in which a diameter EFGH is reduced to a diameter ABCD in an intermediate part of the passage of the duct so as to have a cone angle of 6° in an airflow cross-section as shown in FIGS. 42(b)–(c).

The duct body 20 can include an intake-port side duct body 201 having an open port of an intake port 20A and an exhaust-port side duct body 202 having an open port of an exhaust port 20B, which are connected together at an angle θ of 90° therebetween. In addition, at the intake port 20A, the sirocco fan 14 can be arranged (see FIG. 43).

The intake-port side duct body 201 is provided with the inflated section 30 arranged in the side of the intake port 20A. The length P between the intake port 20A and the intake-port side face 30A of the inflated section 30 is 100 mm. The length Q between the exhaust-port side face 30B of the inflated section 30 and the connection portion (inflected section) between the intake-side and exhaust-side duct bodies 201 and 202 is 200 mm. In the exhaust-port side duct body 202, the length R between the connection portion (inflected section) and the exhaust port 20B is 200 mm.

Therefore, the length Q in the intake-port side duct body 201 is identical to the length R in the exhaust-port side duct body 202. In other words, in the duct 10, the part just at the center of the distance between the exhaust-port side face 30B of the inflated section 30 and the exhaust port 20B is bent at an angle of 90°.

The inflated section 30 is hollow and rectangular cross-section in line with the shape of the duct body 20, and the cross-sectional area thereof is 1.8 times that of the duct body 20. The thickness T of the inflated section 30 is 30 mm. In addition, when the inflated section 30 is formed, deep drawing can be is performed.

The sponge 40 is identical to ones generally used for dish washing and is made of a porous synthetic resin having a thickness of 3 mm.

Therefore, when the sirocco fan 14 (see FIG. 43) is driven, the air exhausted from the sirocco fan 14 enters inside the intake-port side duct body 201 from the intake port 20A. Then, through the inflated section 30, it enters the exhaust-port side duct body 202 so as to be exhausted from the exhaust port 20B outside the exhaust-port side duct body 202, i.e., after the traveling direction of the exhausted air is bent by 90° at the inflected section.

As shown, such a duct 10 can be assembled in a projector 100. FIG. 43 is a schematic view of the projector 100 viewed from an upper part and having the duct 10 according to the first embodiment arranged therein.

The projector 100 can include an outer case 200 having an exhaust port 200A formed on the front face, a power supply unit 300 accommodated in the outer case 200, an optical unit 400 arranged in the outer case 200 and having an L-shape in the plan view, the duct 10 arranged in the outer case 200, and the sirocco fan 14 arranged in the outer case 200, and the entire projector 100 has a substantially rectangular shape.

The optical unit 400, as shown in FIG. 44, is a unit for forming an optical image corresponding to image information by optically processing a luminous flux emitted from a light-source lamp 411. The unit can include an integrator-illumination optical system 410, a color-separation optical system 420, a relay optical system 430, an electro-optical device 440, a cross-dichroic prism 450 as a color-synthesizing optical system, and a projection lens 460 as a projection optical system.

Underneath a light-source device 413, which forms the optical unit 400 and also has the light-source lamp 411, the sirocco fan 14 can be arranged. Accordingly, the sirocco fan 14 inhales the heat in the vicinity of the light-source device 413 thereinto so as to feed the heated air into the intake port 20A of the duct 10. Then, the heated air fed into the duct 10 passes through the inflated section 30 and after changing the direction by 90°, it is exhausted from the exhaust port 200A, which is formed on the front face of the projector 100 beside the projection lens 460.

According to the first embodiment described above, there are numerous advantages. For example, according to the duct 10, the noise level in the vicinity of the exhaust port 20B due to the sirocco fan 14 can be reduced while sufficient exhausting efficiency is maintained. The sound absorbing effect of the duct 10 can be thereby improved. Accordingly, if the duct 10 is used for the projector 100, quietness can be sufficiently secured so as not to give a disagreeable impression to the user even when the projector 100 is used in a home.

Further, since the ratio of the paper constituting the sheet member is 51% or more, the duct 10 can be recycled as reusable paper when the duct 10 is wasted. Therefore, the recycling of the duct 10 is facilitated. Because the sheet member is mainly formed of paper in such a manner, manufacturing cost can be reduced compared to a conventional case of forming with a synthetic resin.

The sheet member forming the duct 10 includes polymethylpentene. Since polymethylpentene is difficult to melt by heat of the high-temperature air flowing inside the duct 10, the shape retention of the duct 10 can be sufficiently secured even at the high temperature. At this time, deep drawing can be performed on the sheet member including polymethylpentene so as to have a cone angle of 6°, so that the duct 10 can be simply configured in line with the shape of a space in the projector 100, for example, thereby improving the degree of freedom in designing the duct 10.

Since the thickness of the duct 10 is 0.5 mm or less, when air vibration is produced, surfaces forming the duct 10 are deflected, thereby absorbing the vibration accompanying the noise, and thus sound absorbing effect of the duct 10 is improved.

Since the duct 10 is made of the sheet member, the noise level in the vicinity of the exhaust port 20B can be reduced by approximately 11 dB (A) in comparison with a duct made of a general synthetic resin (acryl), thereby improving the sound absorbing effect of the duct 10.

Additionally, since the projector 100 is configured including the duct 10, the air in the vicinity of the light-source lamp 411, i.e., the light-source lamp 411 itself, can be cooled while the air after cooling the lamp can be securely exhausted outside the projector 100. Therefore, the heat can be prevented from staying in places in the projector 100 other than the light-source lamp 411.

For duct according to a second embodiment of the present invention, the sheet member according to the first embodiment is changed to the thin plastic sheet (lupilon sheet N made by Mitsubishi Gas Chemical Company. Inc.) having a thickness of 0.5 mm. Only the sheet material is different, and the duct configuration is quite the same as that of the first embodiment. A projector having the duct arranged therein is also the same as that of the first embodiment.

The second embodiment described above has many of the same advantages as that of the first embodiment.

In addition, it should be understood that the present invention is not limited to the embodiments described above. However, other configurations capable of achieving the object of the present invention can be included, and the following modifications may be applied thereto.

For example, according to the embodiments, the cross-section of the duct body 20 is a rectangle, however, it may be other shapes such as a triangle and circle. However, when it being a circle, there can be a disadvantage that a dead space is liable to be produced, so that the shape according to the embodiments is more preferable. In addition, the cross-sectional area of the duct body 20 is not specifically limited. It may be appropriately designed in line with an arrangement space in the projector 100.

According to the embodiments, the cross-sectional area of the inflated section 30 is 1.8 times that of the duct body 20. Other scale factors, such as 2.0 times and 3.0 times, may also be applicable. In other words, the cross-sectional area of the inflated section 30 may be more than approximately 1.5 times that of the duct body 20.

Also, according to the embodiments, the inflated section 30 is arranged in the side of the intake port 20A. It may also be arranged in the side of the exhaust port 20B or in other places. In other words, the inflated section 30 may be arranged in an intermediate part of the passage of the duct body 20. However, the place according to the embodiments has an advantage of a high sound absorbing effect.

Also, according to the embodiments, on internal surfaces of the duct body 20 and the inflated section 30, the sponge 40 with a thickness of 3 mm is arranged. A sponge having another thickness, such as 2 mm, may also be arranged. Also, according to the embodiments, on internal surfaces of the duct body 20 and the inflated section 30, the sponge 40 is arranged. The sponge 40 can also be arranged only in the inflated section 30, or it may be arranged only in the duct body 20. In other words, the sponge may be bonded to the internal surface of the duct body 20 or the inflated section 30. In addition, as long as a sufficient sound absorbing effect is secured, the sponge may not need to be arranged.

Also, as a sound-absorption member made of a porous material, the sponge is adopted. Other materials, such as rock wool and glass wool, may also be used.

Also, according to the embodiments, the angle between the duct bodies 201 and 202 across the inflected section is 90°. It may also be angles less than 135° such as 120° and 45°. However, the angle according to the embodiments can be rather advantageous for easiness in fitting the duct 10 into the outer case 200 of the projector 100.

According to the first embodiment, paper coated with polymethylpentene is used as the sheet member forming the duct body 20. However, instead of the paper, other sheets such as non-woven fabric and heatproof sheet can be used. Also, instead of polymethylpentene, other synthetic resins having burning resistance and workability may be adopted.

Also, according to the embodiments, the thickness of the sheet member is 0.25 mm. However, other thicknesses such as 0.5 mm and 1 mm may be applied. In view of sound absorbing effect, the thicknesses of less than 2.0 mm may be preferable and less than 0.5 mm may be more preferable.

Also, according to the embodiments, the sirocco fan 14 is connected to the intake port 20A of the duct body 20. It may also be connected to the exhaust port 20B. However, the arrangement according to the embodiments can be rather advantageous in terms of the noise level in the vicinity of the exhaust port. In addition, the sirocco fan 14 is adopted as a fan. However, another fan such as an axial-flow fan may be used. In other words, any fan may be used as long as it can blow air.

According to the embodiments, the projector 100 is adopted as an electronic apparatus. However, another electronic apparatus, such as a game machine may be applied.

As described above, a duct and electronic apparatus according to the present invention have advantages of improving sound absorbing effect while securing sufficient exhausting efficiency.

What is claimed is:

1. A duct made of a fiber sheet impregnated with a synthetic resin comprising:
   an intake port and an exhaust port, one of the intake port and the exhaust port is connectable to a fan; and
   a duct passage connecting the intake port and the exhaust port and having a cross-sectional area,
   wherein the synthetic resin is polymethylpentene and drawing performed in an intermediate part of the duct passage so as to reduce the cross-sectional area.

2. The duct according to claim 1, the fiber sheet being paper.

3. The duct according to claim 1, the thickness of the fiber sheet being less than 2 mm.

4. The duct according to claim 3, the thickness of the fiber sheet being not more than 0.5 mm.

5. A duct made of a fiber sheet impregnated with a synthetic resin comprising:
   an intake port and an exhaust port, one of the intake port and the exhaust port is connectable to a fan; and
   a duct passage connecting the intake port and the exhaust port and having a cross-sectional area,
   wherein an inflated section is arranged at an intermediate part of the duct passage, the cross-sectional area of the inflated section is larger than the cross-sectional area of an other section of the duct passage.

6. The duct according to claim 5, the cross-sectional area of the inflated section being larger by approximately 1.5 times than the cross-sectional area of the other section.

7. The duct according to claim 5, the inflated section being arranged in the intake port side of the duct.

8. The duct according to claim 5, comprising a sound-absorption member that is made of a porous material, the sound-absorption member being arranged on internal surfaces of the duct and the inflated section.

9. A duct made of a fiber sheet impregnated with a synthetic resin comprising:
   an intake port and an exhaust port, one of the intake port and the exhaust port is connectable to a fan; and
   a duct passage connecting the intake Port and the exhaust port and having a cross-sectional area,
   wherein an inflected section is arranged at an intermediate part of the duct passage,
   the angle between duct bodies facing each other across the inflected section being less than 135°.

10. An electronic apparatus having a duct made of a fiber sheet impregnated with a synthetic resin comprising:
    an intake port and an exhaust port,
    a duct passage connecting the intake non and the exhaust port and having a cross-sectional area; and
    a fan connected one of the intake port and the exhaust port,
    wherein the synthetic resin is polymethylpentene and drawing performed in an intermediate part of the duct passage so as to reduce the cross-sectional area.

11. The duct according to claim 10, the fiber sheet being paper.

12. The duct according to claim 10, the thickness of the fiber sheet being less than 2 mm.

13. The duct according to claim 12, the thickness of the fiber sheet being not more than 0.5 mm.

14. An electronic apparatus having a duct made of a fiber sheet impregnated with a synthetic resin comprising:
    an intake port and an exhaust port;
    a duct passage connecting the intake port and the exhaust port and having a cross-sectional area; and
    a fan connected one of the intake port and the exhaust port,
    wherein an inflated section is arranged at an intermediate part of the duct passage, the cross-sectional area of the inflated section is larger than the cross-sectional area of an other section of the duct passage.

15. The duct according to claim 14, the cross-sectional area of the inflated section being larger by approximately 1.5 times than the cross-sectional area of the other section.

16. The duct according to claim 14, the inflated section being arranged in the intake port side of the duct.

17. The duct according to claim 14, comprising a sound-absorption member that is made of a porous material, the sound-absorption member being arranged on internal surfaces of the duct and the inflated section.

18. An electronic apparatus having a duct made of a fiber sheet impregnated with a synthetic resin comprising:
    an intake port and an exhaust port;
    a duct passage connecting the intake port and the exhaust port and having a cross-sectional area; and
    a fan connected one of the intake port and the exhaust port,
    wherein an inflected section is arranged at an intermediate part of the duct passage, the
    angle between duct bodies facing each other across the inflected section being less than 135°.

19. A duct made of a single synthetic resin comprising:
    an intake port and an exhaust port, one of the intake port and the exhaust port is connectable to a fan; and
    a duct passage connecting the intake port and the exhaust port and having a cross-sectional area,
    wherein the single synthetic resin has a thickness of less than 2 mm and being capable of reducing a measured characteristic value by at least 3 dB.

20. The duct according to claim 19, the thickness of the synthetic resin being not more than 0.5 mm.

21. The duct according to claim 19, further comprising an inflected section arranged at an intermediate part of the duct passage,
    an angle between duct bodies facing each other across the inflected section being less than 135°.

22. An electronic apparatus, comprising the duct according to claim 19.

23. The duct according to claim 22, the thickness of the synthetic resin being not more than 0.5 mm.

24. The duct according to claim 22, further comprising an inflected section arranged at an intermediate part of the duct passage,
    an angle between duct bodies facing each other across the inflected section being less than 135°.

25. The duct according to claim 5, the fiber sheet being paper.

26. The duct according to claim 5, the thickness of the fiber sheet being less than2 mm.

27. The duct according to claim 26, the thickness of the fiber sheet being not more than 0.5 mm.

28. The duct according to claim 9, the fiber sheet being paper.

29. The duct according to claim 9, the thickness of the fiber sheet being less than 2 mm.

30. The duct according to claim 29, the thickness of the fiber sheet being not more than 0.5 mm.

31. The duct according to claim 14, fiber sheet being paper.

32. The duct according to claim 14, the thickness of the fiber sheet being less than 2 mm.

33. The duct according to claim 32, the thickness of the fiber sheet being not more than 0.5 mm.

34. The duct according to claim 18, the fiber sheet being paper.

35. The duct according to claim 18, the thickness of the fiber sheet being less than 2 mm.

36. The duct according to claim 35, the thickness of the fiber sheet being not more than 0.5 mm.

* * * * *